United States Patent
Kasono et al.

(10) Patent No.: US 8,355,036 B2
(45) Date of Patent: Jan. 15, 2013

(54) RECORDING SYSTEM, RECORDING APPARATUS, AND RECORD CONTROL SIGNAL GENERATING APPARATUS USING AN EXPOSURE BEAM

(75) Inventors: Osamu Kasono, Saitama (JP); Yasuo Hosoda, Saitama (JP)

(73) Assignee: NuFlare Technology, Inc., Numazu-shi (JP)

( * ) Notice: Subject to any disclaimer, the term of this patent is extended or adjusted under 35 U.S.C. 154(b) by 1061 days.

(21) Appl. No.: 12/295,095

(22) PCT Filed: Mar. 27, 2007

(86) PCT No.: PCT/JP2007/056411
§ 371 (c)(1),
(2), (4) Date: Oct. 20, 2008

(87) PCT Pub. No.: WO2007/116741
PCT Pub. Date: Oct. 18, 2007

(65) Prior Publication Data
US 2009/0175143 A1    Jul. 9, 2009

(30) Foreign Application Priority Data
Mar. 28, 2006    (JP) .................................. 2006-088940

(51) Int. Cl.
*B41J 2/47*        (2006.01)
*G11B 20/00*    (2006.01)
(52) U.S. Cl. ..................................... 347/225; 369/47.15
(58) Field of Classification Search .................. 347/225; 369/47.15, 47.49
See application file for complete search history.

(56) References Cited

U.S. PATENT DOCUMENTS

| | | | |
|---|---|---|---|
| 6,735,160 B1 | 5/2004 | Miyashita et al. | |
| 2002/0186632 A1 * | 12/2002 | Kumasaka et al. | ........ 369/47.49 |
| 2004/0188636 A1 | 9/2004 | Hosoda et al. | |

FOREIGN PATENT DOCUMENTS

| | | |
|---|---|---|
| JP | 07-106222 | 4/1995 |
| JP | 2000-207738 | 7/2000 |
| JP | 2002288890 | * 10/2002 |
| JP | 2003-029421 | 1/2003 |
| JP | 2003-078591 | 3/2003 |
| JP | 2003-241394 | 8/2003 |
| JP | 2003-242924 | 8/2003 |
| JP | 2004-303794 | 10/2004 |
| TW | 483001 | 4/2002 |

OTHER PUBLICATIONS

International Search Report dated Jul. 10, 2007, in PCT application.
Taiwanese Official Action—096110627—Feb. 25, 2011.

* cited by examiner

*Primary Examiner* — Stephen Meier
*Assistant Examiner* — Carlos A Martinez
(74) *Attorney, Agent, or Firm* — Oblon, Spivak, McClelland, Maier & Neustadt, L.L.P.

(57) ABSTRACT

A signal generating unit of a formatter inputs a misalignment amount δ unique to an individual recording apparatus and record data into a record signal compensation unit, and in accordance with these the record signal compensation unit generates a compensated beam deflection signal and substrate velocity signal to a beam unit and rotation and movement drive unit. With this arrangement, it is possible to perform compensation which matches errors in individual unit, in response to the errors (mechanical errors) in assembly dimension precision of parts and control precision of control devices which can vary among individual unit of the recording apparatus.

15 Claims, 22 Drawing Sheets

US 8,355,036 B2

RECORDING SYSTEM, RECORDING APPARATUS, AND RECORD CONTROL SIGNAL GENERATING APPARATUS USING AN EXPOSURE BEAM

CROSS-REFERENCE TO RELATED APPLICATION

This application is based on Japanese Patent Application No. 2006-088940 filed on Mar. 28, 2006, the contents of which are incorporated hereinto by reference.

BACKGROUND OF THE INVENTION

1. Field of the Invention

The present invention relates to a recording apparatus using an exposure beam such as an electron beam, a laser beam, a charge beam, or the like, in particular to a record control signal generating apparatus that outputs a control signal to a recording apparatus for manufacturing a master disk of a recording medium such as an optical disk, a magnetic disk, or the like using an exposure beam, and in particular to a recording apparatus and a recording system using the same.

2. Description of the Related Art

Beam recording apparatus performing lithography using an exposure beam such as an electron beam, a laser beam, or the like are widely applied to master disk manufacturing apparatus for large-capacity disks such as digital versatile discs (DVDs), Blu-ray discs, and other optical disks, hard disks for magnetic recording, and so on.

For example, when manufacturing optical disks, and the like, first a predetermined concave and convex pattern is formed on a master disk along a track, and a disk stamper is formed from this master disk. Using the disk stamper, after synthetic resin is hot-pressed or extrusion-molded, and the record surface where a pattern is replicated from the master disk undergoes a metal deposition process, a translucent substrate is formed.

Here, recording of the pattern to the master disk is performed using a beam recording apparatus. With a beam recording apparatus, control is performed such that a spiral (or concentric) track trajectory is drawn on a substrate recording surface, by placing a substrate which acts as the master disk on a spindle (θ stage) that is rotated in a rotating direction (θ direction), and at the same time the rotating spindle itself is placed on a feeding stage (X stage), and fed in a radial direction (X direction) including the center of rotation. (For example, JP, A, 2003-242924 and JP, A, 2003-241394.)

As described above, the beam recording apparatus is originally designed such that when the feeding stage is moved in the X direction, a beam irradiation position passes through the center of rotation of the spindle. In reality, however, there are cases in which it does not pass through the center of rotation due to errors in each recording apparatus, because of dimensional errors or assembly errors in component parts of the recording device. Further, there are cases in which misalignment of the irradiation position occurs due to the control precision when adjusting the beam emitted by the electron column, even if the electron column that emits the beam, the spindle, and the feeding stage are disposed to an appropriate positional relationship, and the amount of this misalignment may change every day (even in the same recording apparatus). If recording is performed with misalignment (=error) occurring between the beam irradiation position and the spindle center of rotation due to such causes, recording precision is difficult to achieve, and there was a possibility of the occurrence of distortion of the recording pattern.

The above problem is given as one example of the problems to be solved by the present invention.

SUMMARY OF THE INVENTION

In order to solve the above problem, in a non-limiting aspect the invention is a record control signal generating apparatus for generating and outputting to a recording apparatus a control signal for forming a latent image, wherein the recording apparatus comprises: beam deflection means for moving an irradiation position of an exposure beam, substrate velocity adjustment means for adjusting a moving velocity of a substrate along a tangential direction or a radial direction, and blanking control means for performing blanking control of irradiation of the exposure beam, the recording apparatus irradiating the exposure beam on a resist layer on the substrate while moving the substrate at the moving velocity along the tangential direction or the radial direction adjusted by the substrate velocity adjustment means, and forming a latent image, the record control signal generating apparatus comprising: record signal input means for inputting a record signal; characteristic information signal input means for inputting a characteristic information signal corresponding to the characteristic information of the recording apparatus as a signal compensation element; and signal generating means for generating a compensated control signal to at least one of the beam deflection means and the substrate velocity adjustment means according to the record signal input by the record signal input means and the characteristic information signal input by the characteristic information signal input means.

Further, in another non-limiting aspect the invention is a recording system comprising: a recording apparatus comprising: beam deflection means for moving an irradiation position of an exposure beam, substrate velocity adjustment means for adjusting a moving velocity of a substrate along a tangential direction or a radial direction, and blanking control means for performing blanking control of irradiation of the exposure bean, the recording apparatus irradiating the exposure beam on a resist layer on the substrate while moving the substrate at the moving velocity along the tangential direction or the radial direction and forming a latent image; and a record control signal generating apparatus for generating to the recording apparatus a control signal for forming the latent image; wherein: at least one of the recording apparatus and the record control signal generating apparatus comprises signal generating means for generating a compensated control signal to at least one of the beam deflection means and the substrate velocity adjustment means of the recording apparatus according to a record signal and a characteristic information signal corresponding to the characteristic information of the recording apparatus.

Further, in another non-limiting aspect the invention is a recording apparatus comprising:

beam deflection means for moving an irradiation position of a light beam, substrate velocity adjustment means for adjusting a moving velocity of a substrate along a tangential direction or a radial direction, blanking control means for performing blanking control of irradiation of the exposure beam; and record control signal generating means for generating a control signal for forming the latent image; the recording apparatus irradiating the exposure beam on a resist layer on the substrate while moving the substrate at the moving velocity along the tangential direction or the radial direction adjusted by the substrate velocity adjustment means, and forming a latent image; wherein: the control signal is compensated according a characteristic information signal corresponding to the characteristic information of the recording apparatus.

DETAILED DESCRIPTION OF THE PREFERRED EMBODIMENTS

An embodiment of the present invention will be described below, with reference to the drawings.

Figure 1:
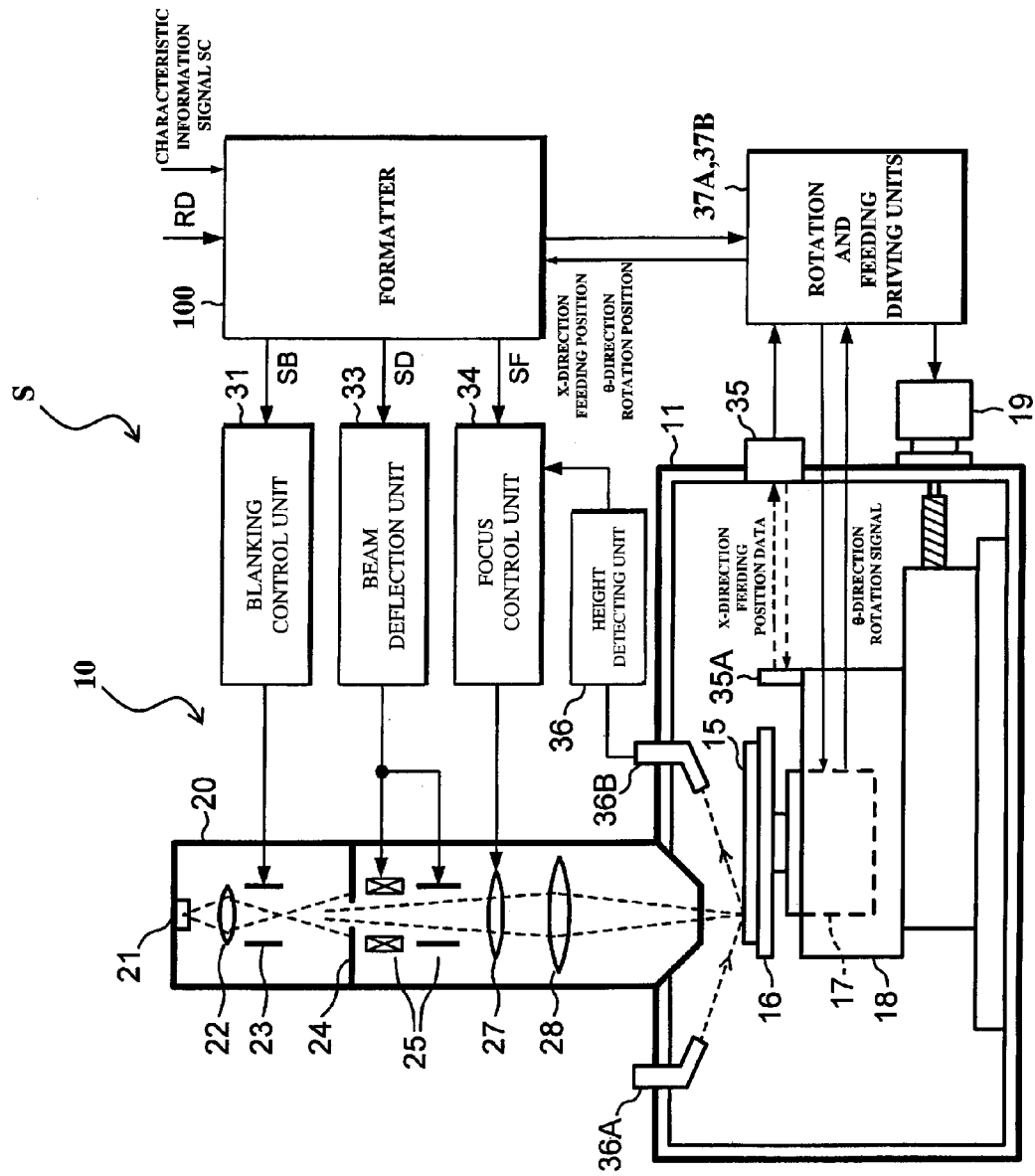
FIG. 1 is a block diagram schematically showing a constitution of a recording system provided with a formatter and a recording apparatus which is a subject thereof according to one embodiment of the present invention.

FIG. 1 is a block diagram schematically showing a constitution of a recording system S provided with a formatter of the present embodiment and a recording apparatus which is a subject thereof. The present embodiment is an embodiment in which the present invention is applied to a disk mastering apparatus for manufacturing a master disk for optical disk manufacturing using an electron beam.

In FIG. 1, an electron beam recording apparatus 10 comprises a vacuum chamber 11, a turntable 16 disposed inside the vacuum chamber 11, a substrate 15 for a disk master disk placed on the turn table 16 and whose surface is coated with a resist, a spindle motor 17 for rotationally driving the turn table 16 around a vertical shaft of a main surface of a disk substrate, a feeding stage (hereafter "X stage" as appropriate) 18 to the top of which is provided the spindle motor 17, and an electron beam column 20 attached to the vacuum chamber 11.

The vacuum chamber 11 is attached via an air damper or other type of vibration isolation platform (not shown), and transmission of vibration from the outside is suppressed. The vacuum chamber 11 is connected to a vacuum pump (not shown), thus ensuring that the interior of the vacuum chamber 11 maintains a vacuum atmosphere of a predetermined pressure by pumping air out of the chamber. Note that the vacuum chamber 11 is provided with a light source 36A for detecting the height of the surface of the substrate 15, and, for example, a light detecting unit 36B including a position sensor, a CCD (charge coupled device), and so on. (A detailed description of functionality is given below.)

The turntable 16 is composed of a dielectric, such as, for example, ceramic, and has an electrostatic chucking mechanism (not shown). The electrostatic chucking mechanism comprises the turntable 16 (ceramic) and an electrode provided inside the turntable 16, made of a conductor for creating electrostatic polarization. A high-voltage power source (not shown) is connected to the electrode, and the substrate 15 is suction-gripped by applying a voltage to the electrode from the high-voltage power source.

The X stage 18 is linked to a feeding motor 19, which is a moving (translational drive) apparatus, and the X stage 18 is capable of moving the spindle motor 17 and the turn table 16 in a predetermined direction (X direction) within a plane parallel to the main surface of the substrate 15. An Xθ stage is constituted by the X stage 18, the spindle motor 17, and the turn table 16.

A reflective mirror 35A, which is part of a laser interference system 35, is disposed to the X stage 18. The laser interference system 35 measures the distance to the X stage using light reflected by the reflective mirror 35A from laser light for measurement from the light source which is not shown, and sends this measurement data, or in other words feeding (X direction) position data of the X stage to stage rotation and feeding driving units 37A and 37B.

A rotation signal of the spindle motor 17 is also sent to the stage rotation and feeding driving units 37A and 37B. This rotation signal includes a rotation sync signal indicating a reference rotation position of the substrate 15 and a pulse signal for every predetermined rotation angle from the reference rotation position. The stage rotation and feeding driving units 37A and 37B obtain from the rotation signal a rotation angle, a rotation speed, and a rotation frequency of the substrate 15.

The stage rotation and feeding driving units 37A and 37B generate and supply to the formatter 100 position data indicating a position of an electron beam spot on the substrate based on the movement position data from the X stage 18 and the rotation signal from the spindle motor 17 obtained as described above. The formatter 100 outputs a control signal to the stage rotation and feeding driving units 37A and 37B based on this position data, and the stage rotation and feeding driving units 37A and 37B drive the spindle motor 17 and the movement motor 19 based on the control signal from the formatter 100. In other words, a rotation angle X of the turntable 16 (in other words, the substrate 15) and amount of movement of the stage 18, which is the drive amount of the spindle motor 17 and the X stage 18, are controlled by the formatter 100 via the stage rotation and feeding driving units 37A and 37B.

Note that a case having an Xθ stage was described above, but a constitution is also possible in which an XY stage is used and X,Y position control of the beam spot is performed by driving the XY stage with the stage rotation and feeding driving units 37A and 37B.

The electron beam column 20 contains an electron beam gun (emitter) 21 for emitting an electron beam, a converging lens 22 for converging the emitted electron beam, a blanking electrode 23, an aperture 24, a beam deflection electrode 25, a focusing lens 27, and an object lens 28 disposed in this order, and further an alignment electrode for performing position compensation of the electron beam based on a beam position compensation signal from the formatter 100.

The electron beam gun 21 emits an electron beam (EB) accelerated to tens of KeV by a cathode (not shown) to which is applied a high voltage supplied from an acceleration high-voltage power source (not shown).

The blanking electrode 23 turns on and off (ON/OFF) the electron beam based on a modulation signal from a blanking control unit 31 controlled by the control signal from the formatter 100. In other words, by applying a voltage to the blanking electrode 23 and greatly inclining the electron beam passing through, the electron beam passing through the aperture 24 can be stopped, and the electron beam can be turned off.

The beam deflection electrode 25 performs deflection control at high speed of the electron beam based on the control signal from a beam deflection unit 33 controlled by the control signal from the formatter 100. With this deflection control, position control of the electron beam spot with respect to the substrate 15 is performed.

The focusing lens 27 is driven based on a drive signal from a focus control unit 34 controlled by the control signal from the formatter 100, and focus control of the electron beam is performed.

At this time, a detection signal is input into the focus control unit 34 from the height detecting unit 36. In other words, the light detecting unit 36B receives a light beam emitted from the light source 36A and reflected off the surface of the substrate 15, and supplies the received signal to the height detecting unit 36. The height detecting unit 36 detects the height of the surface of the substrate 15 based on the received signal and generates a detection signal, and the focus control unit 34 performs focus control of the electron beam based on the detection signal.

Record data RD to be recorded and a characteristic information signal SC (discussed in detail below) indicating characteristics of each electron beam recording apparatus 10 are supplied to the formatter 100 via an appropriate interface which is not shown. The record data RD is modulation data used in disk recording; for example, with a DVD disk, this is modulation data which is a result of 8/16 modulation, and the like. Based on the record data RD, the movement position data and the rotation position data, and further the characteristic information signal SC, the formatter 100 sends a blanking control signal SB (a compensated control signal SBM that will be discussed in detail below), a deflection control signal SD (a signal from an adder 46 discussed below and a signal from the movement drive unit 37B), and a focus control signal SF to the blanking control unit 31, the beam deflection unit 33, and the focus control unit 34, respectively, thus controlling the recording (exposure or irradiation). In other words, recording is performed by irradiating the electron beam on the resist on the substrate 15 based on the record data and forming a latent image corresponding to record pits to places exposed by irradiation of the electron beam only.

Note that in FIG. 1, main signal lines associated with the blanking control unit 31, the beam deflection unit 33, the focus control unit 34, and the stage rotation and feeding driving units 37A and 37B are shown, but these components are bi-directional connected with the formatter 100 and constituted so as to be able to send and receive necessary signals.

The formatter 100 has a signal generating unit for generating a compensated control signal to the beam deflection unit 33 and the stage rotation and feeding driving units 37A and 37B in accordance with the record data RD and the characteristic information signal SC.

Figure 2:
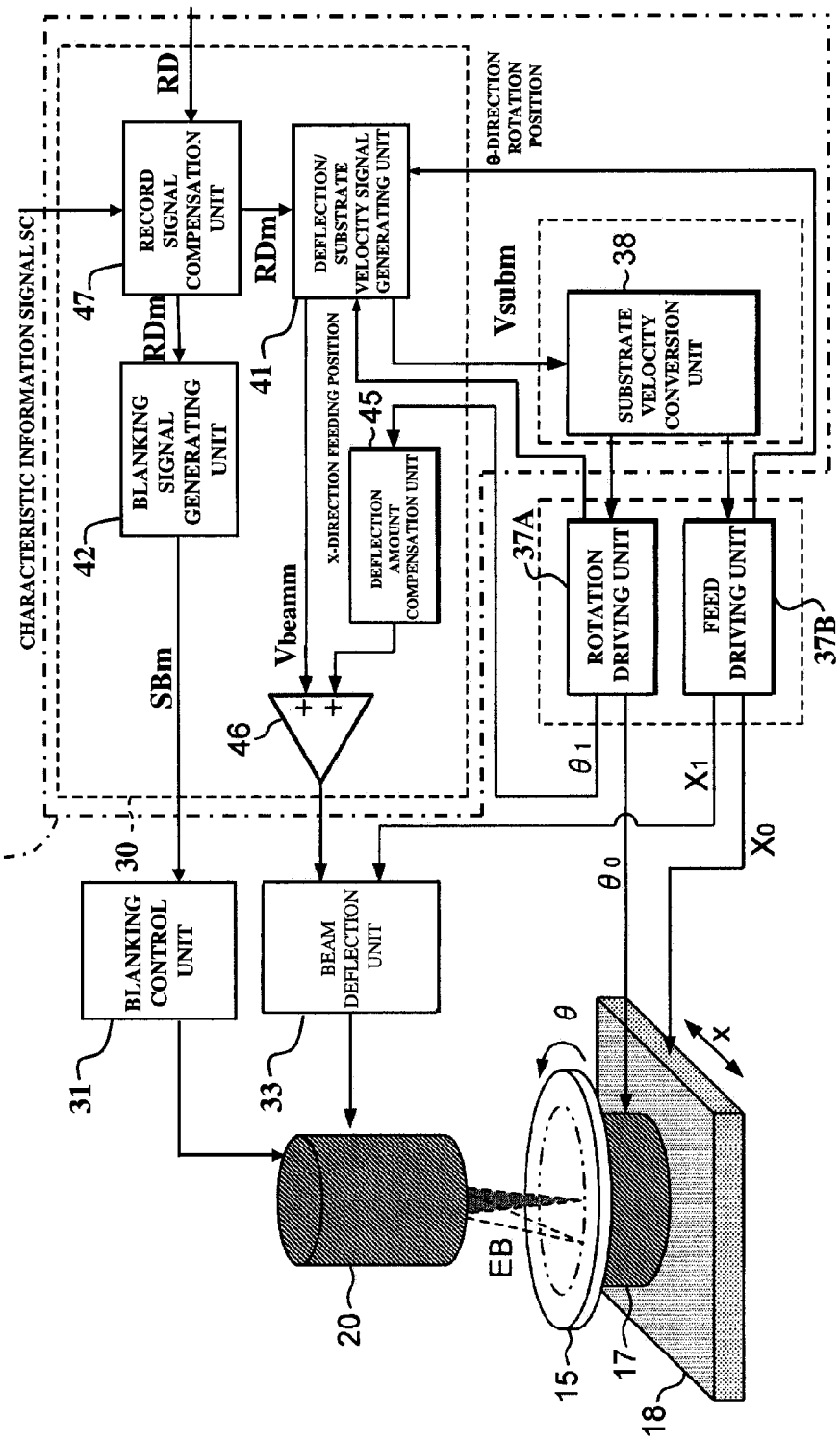
FIG. 2 is a functional block diagram showing one example of a detailed constitution of a portion of the formatter for performing beam deflection control, blanking control, and position control of a substrate.

FIG. 2 is a functional block diagram showing one example of a detailed constitution of a portion of the formatter 100 for performing beam deflection control, blanking control, and position control of the substrate 15. In FIG. 2, the formatter 100 is, in this example, provided with a signal generating unit 30 and a substrate velocity conversion unit 38.

The signal generating unit 30 comprises a record signal compensation unit 47 that compensates the record data RD and outputting it as compensated record data RDM, a deflection/substrate velocity signal generating unit 41 that generates a beam deflection signal VBEAMM and a substrate velocity signal VSUBM based on the compensated record data RDM, a deflection amount compensation unit 45, an adder 46, and a blanking signal generating unit 42 that generates a blanking control signal SBM (compensated) based on the compensated record data RDM.

The record signal compensation unit 47 inputs the record data RD and the characteristic information signal SC from a predetermined operating unit (or other external device) which is not shown, provided to the electron beam recording apparatus 10, compensates the record data RD based on the characteristic information signal SC, and outputs this to the deflection/substrate velocity signal generating unit 41 as the compensated record data RDM.

The deflection/substrate velocity signal generating unit 41 inputs the compensated record data RDM from the record signal compensation unit 47 and, based on this, generates the beam deflection signal VBEAMM designating the beam deflection amount and the substrate velocity signal VSUBM designating the operating velocity of the substrate 15. The deflection/substrate velocity signal generating unit 41 comprises a low-pass filter which is not shown. The low-pass filter extracts from the signal which is the basis for the substrate velocity signal VSUBM those components which are equal to or lower than a predetermined high-pass cut-off frequency FC (discussed in detail below) corresponding to the mechanical tracking limit of the Xθ stage, and supplies this to the substrate velocity conversion unit 38 as the substrate velocity signal VSUBM. Note that a band-pass filter (BPF) can also be used instead of the low-pass filter. The substrate velocity conversion unit 38 breaks the substrate velocity signal VSUBM into a θ component and an X component, and supplies these to the rotation driving unit 37A and the movement (X direction) drive unit 37B, respectively.

The blanking signal generating unit 42 inputs the compensated record data RDM from the record signal compensation unit 47, generates the blanking control signal SBM (compensated) for switching the electron beam on and off (ON/OFF) based on this, and outputs this to the blanking control unit 31.

The rotation driving unit 37A and the movement drive unit 37B drive the spindle motor 17 and the X stage 18 using predetermined frequency components in the θ component and X component of the substrate velocity signal VSUBM of the substrate 15, in according with the fact that the Xθ stage system including the spindle motor 17 and the X stage 18 described above has a mechanical tracking limit. A detailed discussion of this is given using FIG. 3.

Figure 3A:
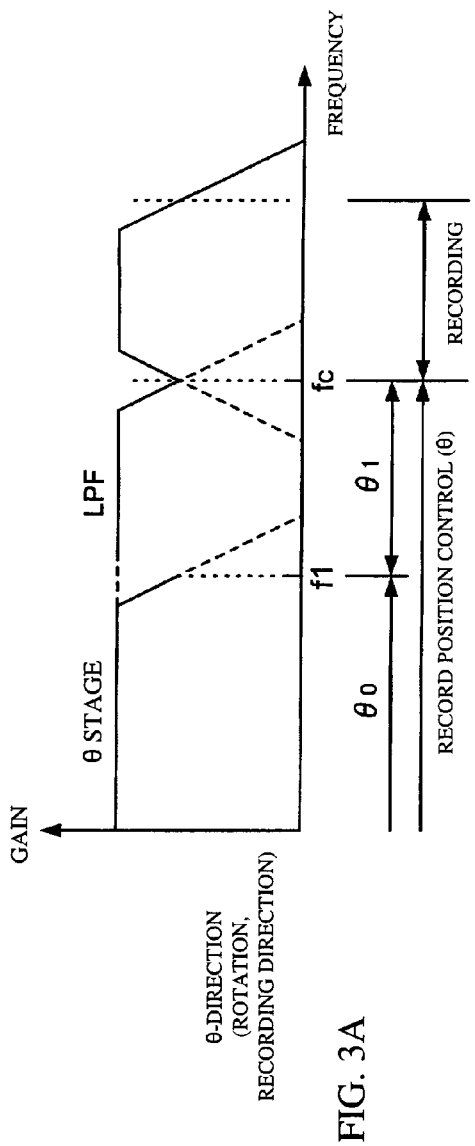
FIG. 3 is an explanatory diagram schematically showing tracking frequency bands of a θ stage and an X stage, the pass frequency band of a low-pass filter, and the frequency band in which recording is performed.
Figure 3B:
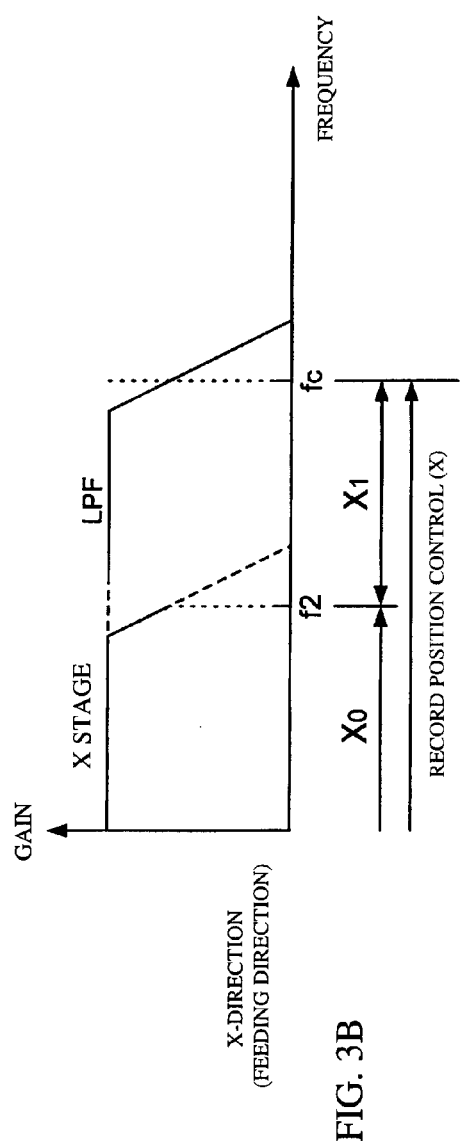

FIG. 3 is an explanatory diagram schematically showing the tracking frequency bands of the θ stage and the X stage, the pass frequency band of the low-pass filter (LPF), and the frequency band in which recording is performed.

In FIG. 3, the tracking limit frequency of the θ stage and the X stage are indicated by F1 and F2, respectively, and the high-pass cut-off frequency of the low-pass filter is indicated by FC. Below the limit frequencies for the θ stage and the X stage, the Xθ stage system is capable of mechanically tracking. In correspondence to this, the rotation driving unit 37A and the movement drive unit 37B extract a frequency rotation component (θ0) and a movement component (X0) below the limit frequencies F1 and F2 from the θ component and the X component in the substrate velocity signal VSUBM of the substrate 15, in order to drive the spindle motor 17 and the X stage 18.

Returning to FIG. 2, the frequency rotation component (θ0) and the movement component (X0) below the limit frequencies F1 and F2 from the θ component and the X component in the substrate velocity signal VSUBM of the substrate 15 extracted as described above are supplied by the rotation driving unit 37A and the movement drive unit 37B to the spindle motor 17 and the movement motor 19. On the other hand, the rotation component (θ1) and the movement component (X1), which are the remains exceeding the limit frequencies (F1 and F2) are supplied by the rotation driving unit 37A to the deflection amount compensation unit 45 or by the movement drive unit 37B to the beam deflection unit 33, respectively.

The deflection amount compensation unit 45 generates a deflection amount corresponding to the remainder component (θ1) and the radius position in the rotation direction of the substrate velocity signal VSUBM, and outputs this to the adder 46.

The adder 46 adds the beam deflection signal VBEAM supplied by the deflection/substrate velocity signal generating unit 41 discussed above and the compensation signal from the beam deflection compensation unit 45, and supplies this to the beam deflection unit 33.

Thus, the remainder error component of the mechanical system (Xθ stage system) with a narrow operating band is added to the beam deflection signal VBEAMM by feeding forward, and is compensated by the deflection of the beam. The frequencies above the cut-off frequency (FC) of the low-pass filter (LPF) described above are used in pit recording.

Figure 4:
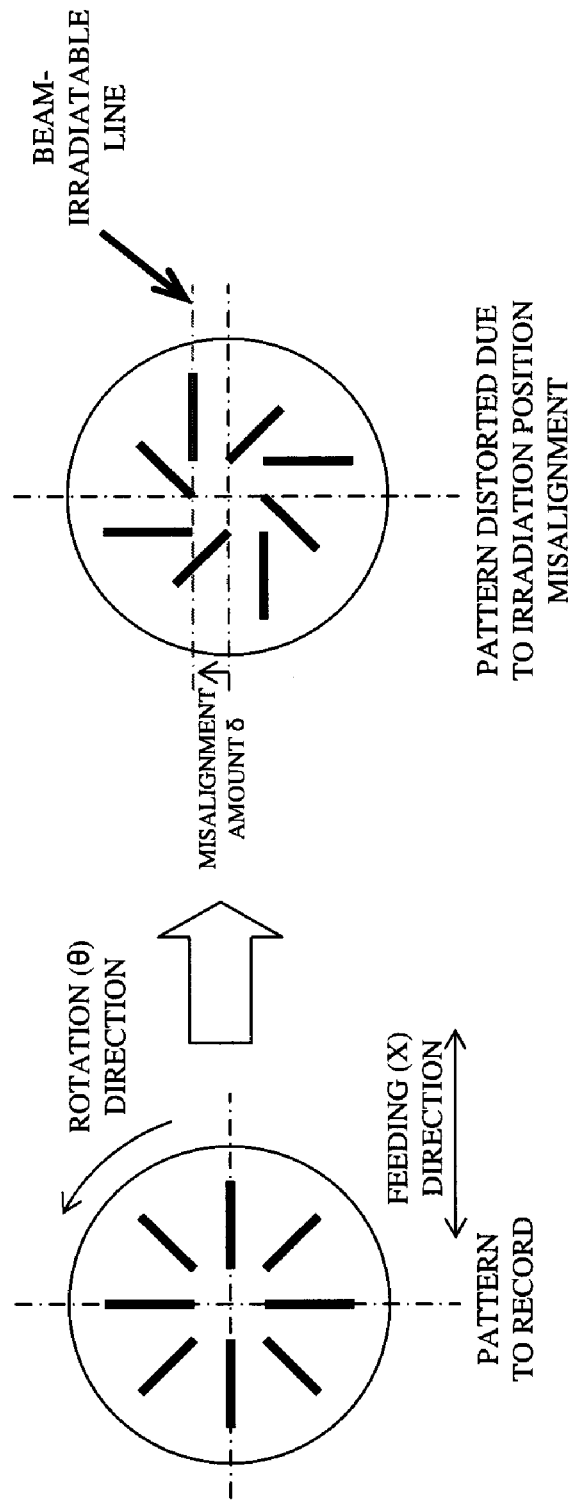
FIG. 4 is an explanatory diagram schematically showing the significance of compensation of the record data in a record signal compensation unit.

FIG. 4 is an explanatory diagram schematically showing the significance of compensation of the record data RD in the record signal compensation unit 47.

In this way, the beam recording apparatus 10 performs control such that a predetermined track trajectory is recorded on the substrate record surface by placing the spindle motor 17 on the X stage 18 and moving it in the radial direction (X direction) including the center of rotation, while placing the substrate 15 on the turn table 16 and rotating the spindle motor 17 in the rotation direction (θ direction). At this time, when the X stage 18 is moved in the X direction, the beam irradiation position is supposed to pass through the center of rotation of the turn table 16 due to the spindle motor 17.

However, in reality, misalignment occurs in every recording apparatus 10 due to dimensional errors and assembly errors of component parts of the beam recording apparatus 10, and there are cases in which the beam irradiation position does not pass through the center of rotation when the X stage 18 is moved in the X direction. Further, there are cases in which misalignment of the irradiation position occurs due to the control precision when adjusting the beam emitted by the electron column 20, even if the electron column 20 emitting the beam, the spindle motor 17, and the X stage 18 are disposed in an appropriate positional relationship, and the amount of this misalignment can change every day (even in the same beam recording apparatus 10). If recording is performed with such a misalignment (a misalignment amount δ, which is the deviation between the target irradiation position and the actual irradiation position) between the beam irradiation position and the center of rotation of the spindle motor 17 due to this cause, recording operation is impossible with good precision, and there is a possibility of distortion occurring in the recording pattern as shown in FIG. 4.

In order to eliminate distortion of recording patterns due to positional misalignment, the signal generating unit 30 of the formatter 100 inputs from external the characteristic information signal (error information signal, deflection information signal) SC corresponding to errors which are mechanical errors based on assembly dimension precision of parts of the recording apparatus 10 and control precision of control devices (the misalignment δ described above, and the like, which can vary among individual units of the recording apparatus 10, and can also vary day by day within the same unit), compensates the record data RD by associating it with the characteristic information signal SC. Based on this, the deflection/substrate velocity signal generating unit 41 generates the substrate velocity signal VSUBM (compensated) and the beam deflection signal VBEAMM, and the blanking signal generating unit 42 generates the blanking signal SBM.

A concrete example is given regarding the characteristic information signal SC below. As described above, the characteristic information (positional misalignment between the beam irradiation position and the center of rotation) mainly occurs due to the following factors.

1) Dimensional errors and assembly errors of component parts of the recording apparatus 2) Misalignment due to adjustment of the electrooptical system The former error has a large absolute value, often reaching from hundreds of μm to several mm, and the latter is almost always around a few μm as a typical value, although it can be several hundred μm at most.

1) Dimensional Errors and Assembly Errors of Component Parts of the Recording Apparatus While the dimensional errors and assembly errors can reach several hundred μm to several mm, changes almost never occur as long as the unit is not disassembled and re-assembled. Therefore, if the manufacturer does the following:
assembles the electron beam recording apparatus 10;
measures misalignment between the beam irradiation position and the center of rotation;
sets the characteristic information SC to the record signal generating apparatus 100;
and the user can tolerate the electrooptical system misalignment discussed below; the unit can be used in this semi fixed state. In other words, the user can achieve recording patterns without errors if considering the electron beam recording apparatus 10 including the record signal generating apparatus 100 as a single unit and providing the signal RD to be recorded.

2) Adjustment of the Electrooptical System

The frequency of adjustment of the electrooptical system varies depending on the requisite quality of the electron beam (beam diameter of the electron beam, and the like). For example, if an attempt is made to achieve the narrowest beam diameter obtainable with the electrooptical system, that beam diameter is difficult to maintain for long periods of time, but if a compromise is made for the beam diameter considering productivity, then it can be maintained for long periods of time.

In other words, cases are possible depending on the user in which adjustment is necessary once every several months, once every several weeks, once a week, daily, for every record substrate, or for every particular recording area in a substrate. Therefore, the cycle of:
beam adjustment;
measuring of misalignment between the beam irradiation position and the center of rotation;
setting the characteristic information SC to the record signal generating apparatus 100;
exposure is repeated at fixed intervals.

Note that the beam adjustment being discussed here is the adjustment relating to the electron beam itself. Specifically, the adjustment of the beam being discussed here is, for example, adjustment of setting values of the drive circuits for the plurality of electron lenses in the various parts of the electron beam column (magnetic lenses, electrostatic lenses), and mechanical adjustment of the position of the emitter and the position of the aperture. It is possible to narrow the beam to below a desired beam diameter that is compliant with the recording pattern by this adjustment.

Figure 5:
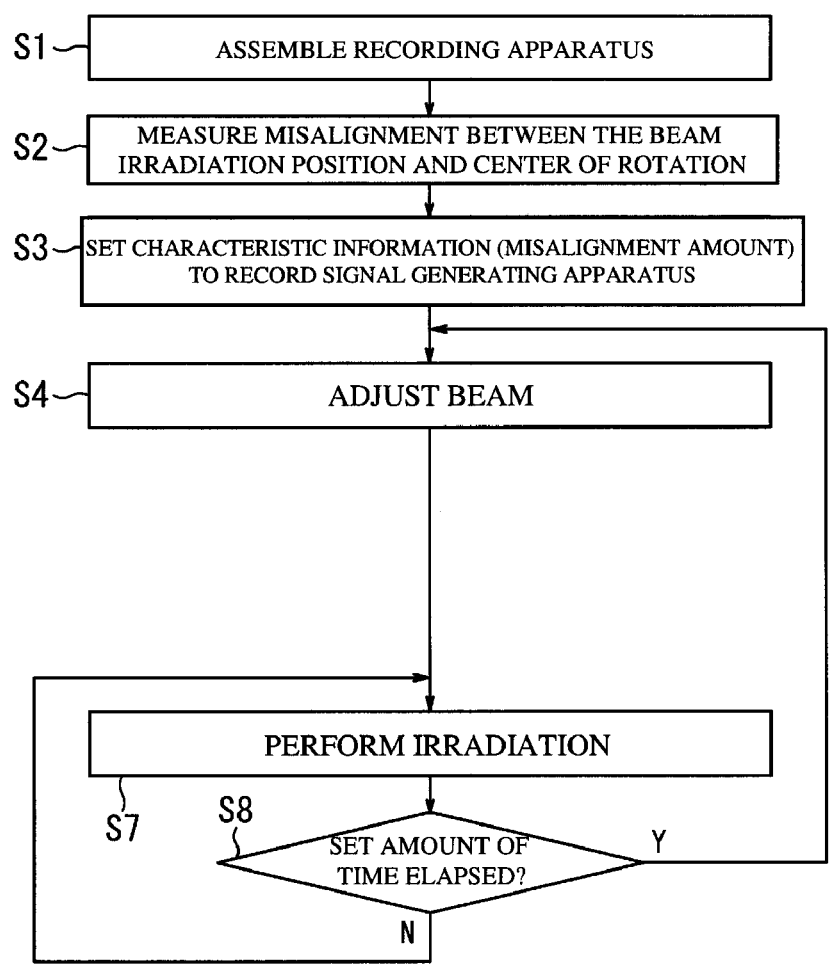
FIG. 5 is a flowchart showing an example of an adjustment method in a case in which fine irradiation position misalignment need not be taken into consideration very much.

FIG. 5 is a flowchart showing an example of an adjustment method in a case in which fine irradiation position misalignment need not to be taken into consideration very much.

In step S1, assembly of the electron beam recording apparatus 10 is performed. Next, in step S2, misalignment between the beam irradiation position and the center of rotation is measured, as discussed above. Next, in step S3, the characteristic information (misalignment amount) is set to the record signal generating unit 100, as described above. Step S1 to step S3 are works performed by the apparatus maker (manufacturer), and in particular step S2 and step S3 are steps performed when assembling the electron beam recording apparatus 10, and may be performed at one time.

Next, on the other hand, in step S7, exposure is performed using the electron beam recording apparatus 10. Next, in step S8, a judgment is made as to whether a fixed amount of time has elapsed. If a fixed amount of time has not elapsed, step S7 is executed again, and if, on the other hand, a fixed amount of time has elapsed, step S4 is executed again. Steps S4 (and step S7) are steps performed by the user to whom the electron beam recording apparatus 10 is delivered.

Figure 6:
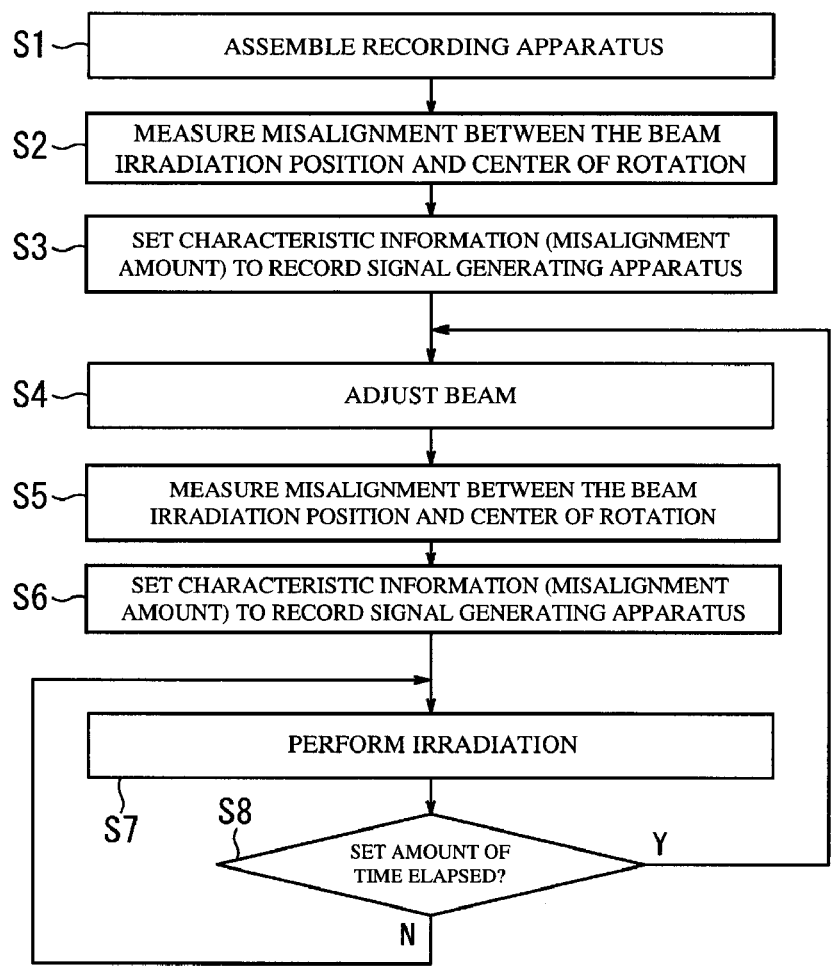
FIG. 6 is a flowchart showing an example of an adjustment method in which irradiation position misalignment is performed for each beam adjustment.

FIG. 6 is a flowchart showing an example of an adjustment method in which irradiation position misalignment is performed for each beam adjustment. Note that description of steps shown in FIG. 6 which are the same as those shown in FIG. 5 is omitted, the differences mainly being described below.

As shown in FIG. 5, after step S1 to step S3 have been executed by the apparatus manufacturer, and step S4 has been executed by the user, then step S5, shown next, is executed by the user. In step S5, the positional misalignment between the beam irradiation position and the center of rotation is measured. Next, in step S6, the setting of the characteristic information (misalignment amount) to the record signal generating unit 100 is performed. Next, in step S7, exposure is performed using the electron beam recording apparatus 10 as described above. Next, in step S8, a judgment is made as to whether a fixed amount of time has elapsed. If a fixed amount of time has not elapsed, step S7 is executed again, and if, on the other hand, a fixed amount of time has elapsed, step S4 to step S7 is executed again. Step S4 to step S6 (and step S7) are steps performed by the user to whom the electron beam recording apparatus 10 is delivered.

The following exemplifies a positional misalignment measurement method between the beam irradiation position and the center of rotation.

There are several methods for the positional misalignment measuring method between the beam irradiation position and the center of rotation.

1) Misalignment Amount Measurement Method Using Pattern Recording

If a radiating pattern is recorded as in FIG. 4 and the pattern shape after development is observed using a length-measuring microscope, and the like, the misalignment amount can be measured.

2) Misalignment Measurement Method Using Pattern Observation

The misalignment amount can be measured by disposing a grating, and the like, to a rotating stage inside a vacuum chamber, and observing a secondary electron image while rotating the sample, as in the reference document (Appl. Opt. Vol. 33, No. 10, 2032 (1994), Shiro Ogata et al., "Electron-Beam Writing System And Its Application To Large And High-Density Diffractive Optic Elements").

As described above, the record signal generating apparatus 100 according to the present embodiment for generating and outputting to a recording apparatus (in this example, the electron beam recording apparatus) 10 a control signal for forming a latent image, the recording apparatus 10 comprising: a beam deflection unit (in this example, the beam deflection unit) 33 that moves an irradiation position of the exposure beam relative to the substrate 15 on which a resist layer has been formed, a substrate velocity adjustment unit (in this example, the rotation and feeding driving units) 37A and 37B that adjusts a tangential direction or radial direction moving velocity of the substrate 15, and a blanking control unit (in this example, the blanking control unit) 31 that performs blanking control of irradiation of the exposure beam, the recording apparatus 10 irradiating the exposure beam on resist layer with the beam deflection unit 33 while moving the substrate 15 at the tangential direction or radial direction moving velocity adjusted by the substrate velocity adjustment unit 37A and 37B, and forming a latent image; the record control signal generating apparatus 100 comprising: a record signal input unit that inputs a record signal (in the example, the record data) RD; a characteristic information input unit that inputs a characteristic information signal SC corresponding to characteristic information (in this example, the misalignment amount δ) of the recording apparatus 10 as a signal compensation element; and a signal generating unit (in this example, the signal generating unit) 30 that generates a compensated control signal (in this example, the beam deflection signal VBEAMM and the substrate velocity signal VSUBM) to at least one of the beam deflection unit 33 and the substrate velocity adjustment unit 37A and 37B according to the record signal RD input by the record signal input unit and the characteristic information signal SC input by the characteristic information signal input unit.

With the record control signal generating apparatus 100 of the present embodiment, the characteristic information signal SC for the corresponding recording apparatus 10 is input by the characteristic information signal input unit, the record signal RD is input by the record signal input unit, and the compensated control signal (in this example, the beam deflection signal VBEAMM and the substrate velocity signal VSUBM) is generated to at least the beam deflection unit 33 and the substrate velocity adjustment unit 37A and 37B by the signal generating unit 30 in response to the record signal RD and the characteristic information signal SC as a compensation element.

It is thus possible to generate the compensated control signals VBEAMM and VSUBM which have been subjected to compensation matching the errors of each unit corresponding to the errors (mechanical errors) based on assembly dimension precision of each part and control precision of control devices which can vary from unit to unit of the recording apparatus 10, and output these to corresponding units. As a result, the corresponding recording apparatus 10 which has input the compensated control signals VBEAMM and VSUBM can perform a high-precision recording operation with reduced (or eliminated) errors. Further, for a case in which error characteristics may differ from day to day even within the same recording apparatus 10, it is possible to accommodate accurately those changing characteristics and perform high-precision recording operations.

Further, even if errors are not taken into consideration, it is also possible to provide to each of a plurality of types of the recording apparatus 10, which have a common control mode in base portions but differing control modes in other portions, a common control program corresponding to the base portions and input compensated control signals from the record control signal generating apparatus 100 to each of the recording apparatus 10, by considering the content of control programs corresponding to the other portions as the characteristics of the recording apparatus 10 and as the compensation element. In this case, it is enough to prepare only one common control program for the plurality of types of the recording apparatus 10, therefore making it possible to simplify and streamline the control constitution and control program and reduce manufacturing costs.

In the record control signal generating apparatus 100 according to the present embodiment, the signal generating unit 30 comprises a first signal compensation unit (in this example, the record signal compensation unit) 47 that compensates the record signal RD input by the record signal input unit based on the characteristic information signal SC input by the characteristic information signal input unit, and a first deflection substrate control signal generating unit (in this example, deflection/substrate velocity signal generating unit) 41 that generates the compensated control signals VSUBM and VBEAMM to the beam deflection unit 33 and the substrate velocity adjustment unit 37A and 37B according to the record signal RD compensated by the first signal compensation unit 47.

By using a constitution in which the record signal RD input by the record signal input unit is compensated by the first signal compensation unit 47 and then supplied to the first deflection/substrate velocity signal generating unit 41, the only signal that needs to be compensated is the record signal RD only, making it possible to achieve a simplified control constitution.

In the record control signal generating apparatus 100 according to the present embodiment described above, the characteristic information input unit inputs as the characteristic information signal an error information signal SC corresponding to error information (in this example, the misalignment amount δ) based on the dimensional precision and control precision of the recording apparatus 10.

By inputting the record signal RD and the error information signal SC as the compensation element, and generating accordingly a compensated signal to the beam deflection unit 33 and the substrate velocity adjustment unit 37A and 37B with the signal generating unit 30, a compensated control signal which matches the errors of each unit can be generated which accommodates the errors (mechanical errors) based on assembly dimension precision of parts and control precision of control devices which can vary from unit to unit in the recording apparatus 10, and thus matches these errors in individual units.

In the record control signal generating apparatus 100 according to the present embodiment, the characteristic information signal input unit inputs as the error information signal a deviation information signal SC corresponding to a deviation (in this example, the misalignment amount δ) between a target irradiation position and an actual irradiation position by the exposure beam.

As a result, it is thus possible to generate the compensated control signals VSUBM and VBEAMM which matches the error of each unit, in response to the misalignment deviation between the target irradiation position and the actual irradiation position based on the assembly dimension precision of parts and the control precision of the control devices which varies among individual units of the recording apparatus 10.

Note that with the formatter 100 of the present embodiment, in the signal generating unit 30, the beam deflection signal VBEAMM, the substrate velocity signal VSUBM, and the blanking signal SBM were generated by compensating the record data RD with the record signal compensation unit 47 and then inputting the compensated record data RD into the deflection/substrate velocity signal generating unit 41 and the blanking signal generating unit 42, but this is not a limitation, as compensation may also be performed afterward.

Figure 7:
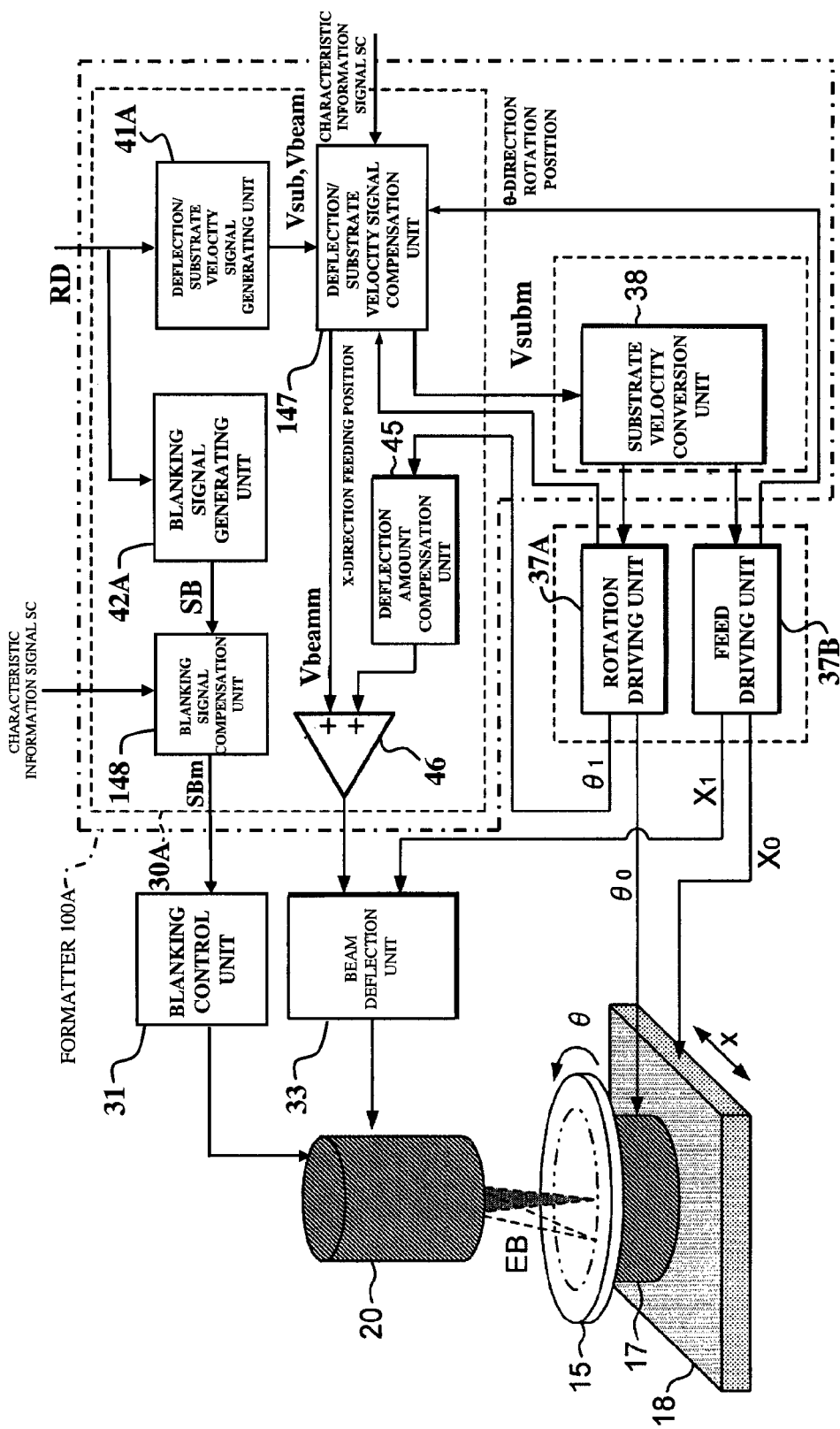
FIG. 7 is a functional block diagram showing one example of a detailed constitution of portions of the formatter for performing beam deflection control, blanking control, and substrate position control, according to a modification for generating a beam deflection signal, a substrate velocity signal, and a blanking signal and then performing compensation.

FIG. 7 is a functional block diagram showing one example of a detailed constitution of a portion of the formatter 100 according to the modification for performing beam deflection control, blanking control, and position control of the substrate 15, and corresponds to FIG. 2 described above. In FIG. 7, the formatter 100A comprises, in this example, a signal generating unit 30A equivalent to the signal generating unit 30 described above, and a substrate velocity conversion unit 38 such as the one described above.

The signal generating unit 30A has a deflection/substrate velocity signal generating unit 41A, a blanking signal generating unit 42A, a deflection/substrate velocity signal compensation unit 147, a blanking signal compensation unit 148, a deflection amount compensation 45 and an adder 46 as above.

The deflection/substrate velocity signal generating unit 41A comprises equivalent functionality to the deflection/substrate velocity signal generating unit 41 described above, and inputs the record data RD via an interface which is not shown and generates the beam deflection signal VBEAM and the substrate velocity signal VSUB (uncompensated) as a basic control signal. The deflection/substrate velocity signal compensation unit 147 inputs the characteristic information signal SC described above via an interface which is not shown, and, based on the characteristic information signal, compensates the beam deflection signal VBEAM and the substrate velocity signal VSUB from the deflection/substrate velocity signal generating unit 41A, generates the beam deflection signal VBEAMM and the substrate velocity signal VSUBM as the compensated control signals, and outputs these signals to the substrate velocity conversion unit 38.

The blanking signal generating unit 42A comprises the same functionality as the blanking signal generating unit 42, inputs the record data RD, and generates the blanking control signal SB (uncompensated). The blanking signal compensation unit 148 inputs the characteristic information signal SC described above via an interface which is not shown, compensates the blanking signal SB from the blanking signal generating unit 42A based on the characteristic information signal, generates a compensated blanking signal SBM, and outputs the compensated blanking signal to the blanking control unit 31.

The record signal generating apparatus 100 according to the present modification that generates and outputting to a recording apparatus 10 a control signal for forming a latent image, the recording apparatus 10 comprising a beam deflection unit 33 that moves an irradiation position of the exposure beam relative to the substrate 15 on which a resist layer has been formed, substrate velocity adjustment unit 37A and 37B that adjusts a tangential direction or radial direction moving velocity of the substrate 15, and a blanking control unit 31 that performs blanking control of irradiation of the exposure beam, the recording apparatus 10 irradiating the exposure beam on resist layer with the beam deflection unit 33 while moving the substrate 15 at the tangential direction or radial direction moving velocity adjusted by substrate velocity adjustment unit 37A and 37B, and forming a latent image; the record control signal generating apparatus 100 comprising: a record signal input unit (in this example, the interface described above) that inputs a record signal RD; a characteristic information input unit (in this example, the interface described above) that inputs a characteristic information signal SC corresponding to the characteristic information of the recording apparatus 10 as a signal compensation element; and a signal generating unit 30 that generates a compensated control signal (in this example, the beam deflection signal VBEAMM and the substrate velocity signal VSUBM) to at least one of the beam deflection unit 33 and the substrate velocity adjustment unit 37A and 37B according to the record signal RD input by the record signal input unit and the characteristic information signal SC input by the characteristic information signal input unit.

With the record control signal generating apparatus 100 of the present modification, the characteristic information signal SC for the corresponding recording apparatus 10 is input by the characteristic information signal input unit, the record signal RD is input by the record signal input unit, and the compensated control signals VBEAMM and VSUBM are generated to at least the beam deflection unit 33 and the substrate velocity adjustment unit 37A and 37B by the signal generating unit 30.

With this arrangement, it is thus possible to generate the compensated control signals VBEAMM and VSUBM, which have been subjected to compensation that matches the errors of each unit, in response to the errors (mechanical errors), based on assembly dimension precision of each part and control precision of control devices which can vary from unit to unit of the recording apparatus 10, and output the compensated control signals to corresponding units. As a result, the corresponding recording apparatus 10 with input compensated control signals VBEAMM and VSUBM can perform a high-precision recording operation with reduced (or eliminated) errors. Further, in a case in which error characteristics may differ from day to day even within the same recording apparatus 10, it is possible to accurately accommodate those changing characteristics and perform high-precision recording operations.

Further, even if errors are not taken into consideration, it is also possible to provide to each of a plurality of types of the recording apparatus 10, which have a common control mode in base portions but differing control modes in other portions, a common control program corresponding to the base portions, and input the compensated control signals from the record control signal generating apparatus 100A to each of the recording apparatus 10, by considering the content of the control programs corresponding to the other portions as the characteristics of the recording apparatus 10 and as the compensation element. In this case, it is enough to prepare only one common control program for the plurality of types of the recording apparatus 10, therefore making it possible to simplify and streamline the control constitution and control program and reduce manufacturing costs.

In the record control signal generating apparatus 100A according to the modification above, the signal generating unit 30 comprises a second deflection substrate control signal generating unit 41A that generates the basic control signals VSUB and VBEAM to the beam deflection unit 33 and the substrate velocity adjustment unit 37A and 37B in accordance with the record signal RD input by the record signal input unit, and a second compensation unit 147 that compensates the basic control signals VSUB and VBEAM generated by the second deflection substrate control signal generating unit 41A based on the characteristic information signal SC input by the characteristic information signal input unit and generating compensated control signals VSUB and VBEAMM.

By using a constitution in which the basic control signals VSUB and VBEAM are created by the second deflection substrate control signal generating unit 41A from the record signal RD input by the record signal input unit, and supplying the basic control signals to the second signal compensation unit 147, compensation is performed immediately before outputting finally these signals from the record signal generating apparatus 10A, and therefore the corrective effect of compensation can be improved.

Next, the details about the compensation process in the formatter 100 and 100A in the above embodiment and modification are described. An example of a method for compensation executed by the record signal compensation unit 47 in the formatter 100 and by the deflection/substrate velocity signal compensation unit 147 and the blanking signal compensation unit 148 in the formatter 100A based on the characteristic information signal SC is described below.

(1) Compensation Using Coordinate Conversion and Signal Delay

Figure 8:
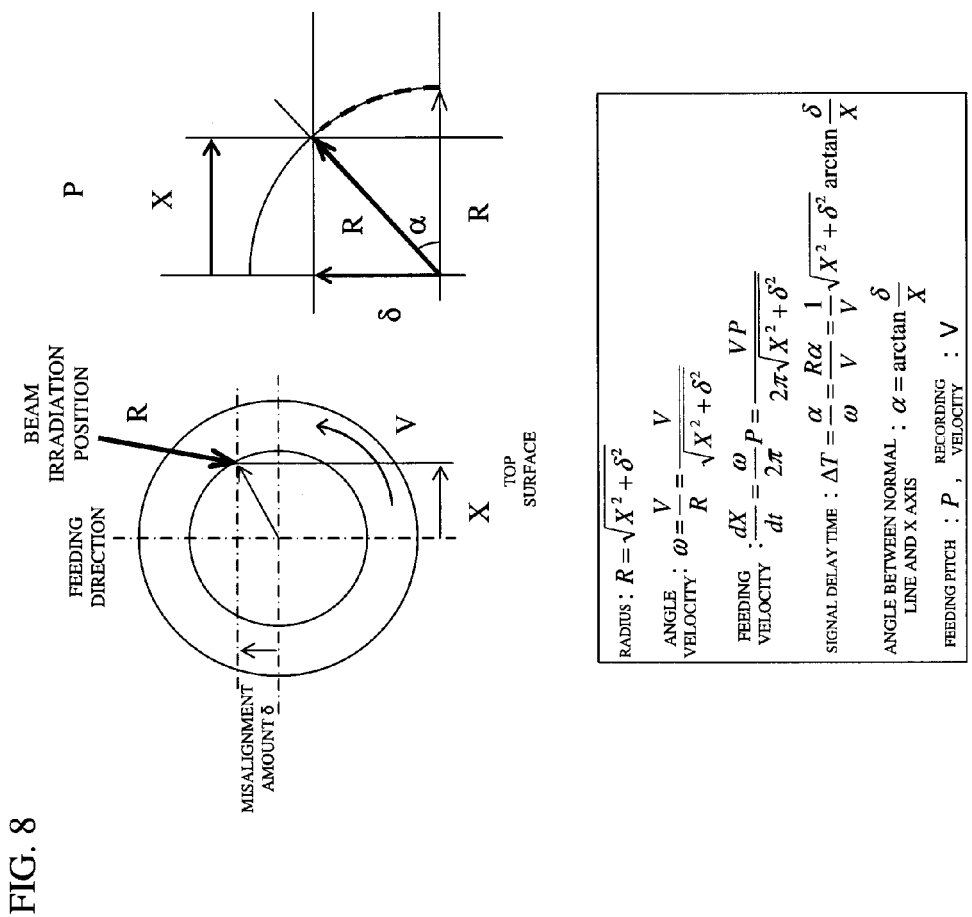
FIG. 8 is an explanatory diagram for describing compensation performed using coordinate conversion and signal delay.

FIG. 8 is an explanatory diagram for describing compensation using this method. In FIG. 8, for the coordinate system, a movement direction position X detected by the laser interference system 35 and a value of δ based on the characteristic information signal SC described above are used such that:

$$\text{Radius } R = (X^2 + \delta^2)^{1/2}$$

For the angular velocity and the movement velocity, the recording velocity is V, the movement pitch is P, such that:

$$\text{Angular velocity } \omega = V/R = V/(X^2 + \delta^2)^{1/2}$$

$$\text{Feeding velocity } DX/DT = (\omega/2\pi)P$$

$$= VP/2\pi(X^2 + \delta^2)^{1/2}$$

The conversion of spatial coordinates from an XY coordinate system (X,Y) to a radial direction coordinate system (R,θ) is thus performed. Conversion of the time coordinates (in this example, a delay process) should be performed for the position in the θ direction. In other words, based on:

$$\text{Angle } \alpha \text{ formed by a normal line and the X-axis} = \text{ARCTAN}(\delta/X)$$

a signal delay time ΔT becomes:

$$\Delta T = \alpha/\omega$$
$$= R\alpha/V$$
$$= \text{ARCTAN}(\delta/X) * (X^2 + \delta^2)^{1/2}/V$$

In the embodiment shown in FIG. 2, the record data RD is re-read and record data RDM is generated using the above method by the record signal compensation unit 47. In the modification shown in FIG. 7, the blanking control signal SB, the beam deflection signal VBEAM, and the substrate velocity signal VSUB are re-read and a blanking control signal SBM, a beam deflection signal VBEAMM, and a substrate velocity signal VSUBM are generated by the blanking signal compensation unit 148 and the deflection/substrate velocity signal compensation unit 147 using the above method.

In the record control signal generating apparatus 100 of the present modification, the first or second signal compensation unit 47, 147, and 148 perform compensation based on the characteristic information signal SC using the coordinate system conversion process using the deviation information signal, and the delay process of the timing of the blanking control using the deviation information signal in the blanking control unit 31, and in accordance with the compensation, the signal generating unit 30 comprising the first or second signal compensation unit 47, 147, and 148 generates the compensated signals (in this example, the beam deflection signal VBEAMM, the substrate velocity signal VSUBM, and the blanking control signal SBM) to the beam deflection unit 33, the substrate velocity adjustment unit 37A and 37B, and the blanking control unit 31.

With this arrangement, coordinate conversion is thus performed for a different system corresponding to the misalignment deviation between the target irradiation position and the actual irradiation position which differs from unit to unit of the recording apparatus 10, and further the timing of the blanking control for starting and stopping irradiation is delayed so as to corresponding with this deviation, thereby making it possible to generate the compensated control signals VBEAMM, VSUBM, and SBM so as to absorb errors of each unit.

(1') Performing Coordinate Conversion Using an Approximation Formula

Figure 9:
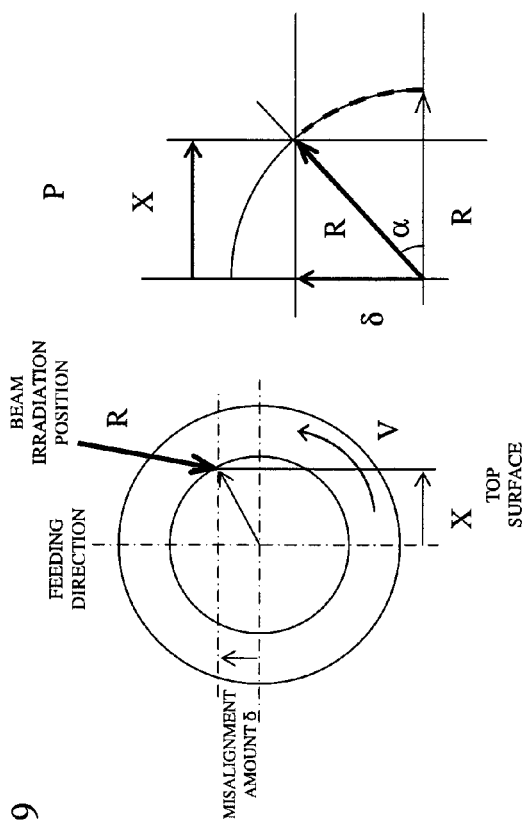
FIG. 9 is an explanatory diagram for describing a case in which approximation up to N=0 terms is performed in coordinate conversion.

In the method described in (1) above, it is also possible to perform coordinate conversion using an approximation formula. For example, when performing approximation up to N=0 terms, as shown in FIG. 9, then the formulas above may be approximated and used as shown below.

$$\text{Radius } R = (X^2 + \delta^2)^{1/2}$$
$$= X(1 + \delta^2/X^2)^{1/2}$$
$$\neq X$$

$$\text{Angular velocity } \omega = V/R$$
$$= V/(X^2 + \delta^2)^{1/2}$$
$$= (V/X)(1 + \delta^2/X^2)^{1/2}$$
$$\neq V/X$$

$$\text{Angle } \alpha \text{ formed by a normal line and the X-axis} = \text{ARCTAN}(\delta/X)$$
$$\neq \delta/X$$

$$\text{Signal delay time } \Delta T = \alpha/\omega$$
$$= R\alpha/V$$
$$\neq X(\delta/X)/V$$
$$= \delta/V$$

Figure 10:
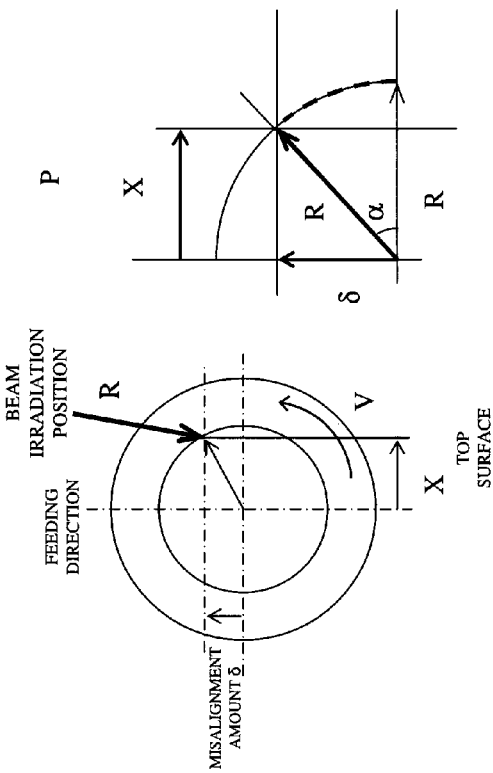
FIG. 10 is an explanatory diagram for describing a case in which approximation up to N=1 term is performed in coordinate conversion.

Alternately, for example, when performing approximation up to N=1 terms, as shown in FIG. 10, then the formulas above may be approximated and used as shown below.

Figure 11:
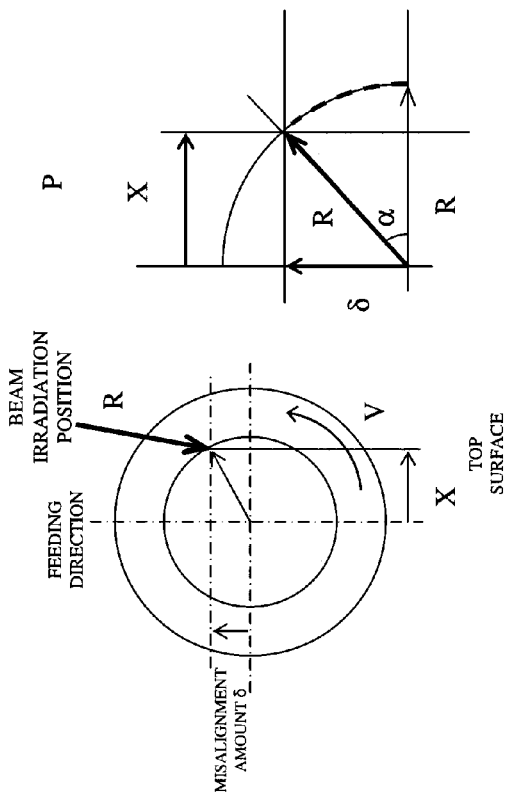
FIG. 11 is an explanatory diagram for describing a case in which approximation up to N=2 terms is performed in coordinate conversion.

Radius $R = (X^2 + \delta^2)^{1/2}$
$= X(1 + \delta^2/X^2)^{1/2}$
$\neq X(1 + \delta^2/2X^2)$ Angular velocity $\omega = V/R$
$= V/(X^2 + \delta^2)^{1/2}$
$= (V/X)(1 + \delta^2/X^2)^{-1/2}$
$\neq (V/X)(1 - \delta^2/2X^2)$ Angle α formed by a normal line and the X-axis=ARCTAN (δ/X)
$\neq \delta/X(1-\delta^2/3X^2)$ Signal delay time $\Delta T = \alpha/\omega$
$= R\alpha/V$
$\neq (X/V)(\delta/X)(1 + \delta^2/2X^2)(1 - \delta^2/3X^2)$
$\neq (\delta/V)(1 + \delta^2/6X^2)$ Further, for example, when performing approximation up to N=2 terms, as shown in FIG. 11, then the formulas above may be approximated and used as shown below.

Radius $R = (X^2 + \delta^2)^{1/2}$
$= X(1 + \delta^2/X^2)^{1/2}$
$\neq X(1 + \delta^2/2X^2 - \delta^4/8X^4)$ Angular velocity $\omega = V/R$
$= V/(X^2 + \delta^2)^{1/2}$
$= (V/X)(1 + \delta^2/X^2)^{-1/2}$
$\neq (V/X)(1 - \delta^2/2X^2 + 3\delta^4/8X^4)$ Angle α formed by a normal line and the X-axis=ARCTAN (δ/X)
$\neq \delta/X (1-\delta^2/3X^2+\delta^4/5X^4)$ Signal delay time $\Delta T = \alpha/\omega$
$= R\alpha/V$
$\neq (X/V)(\delta/X)(1 + \delta^2/2X^2 - \delta^4/8X^4)$
$(1 - \delta^2/3X^2 + \delta^4/5X^4)$
$\neq (\delta/V)(1 + \delta^2/6X^2 - 11\delta^4/120X^4)$ The same effect as the method described in (1) above can be obtained using the method using the approximations described using FIG. 9 to FIG. 11.

Figure 12:
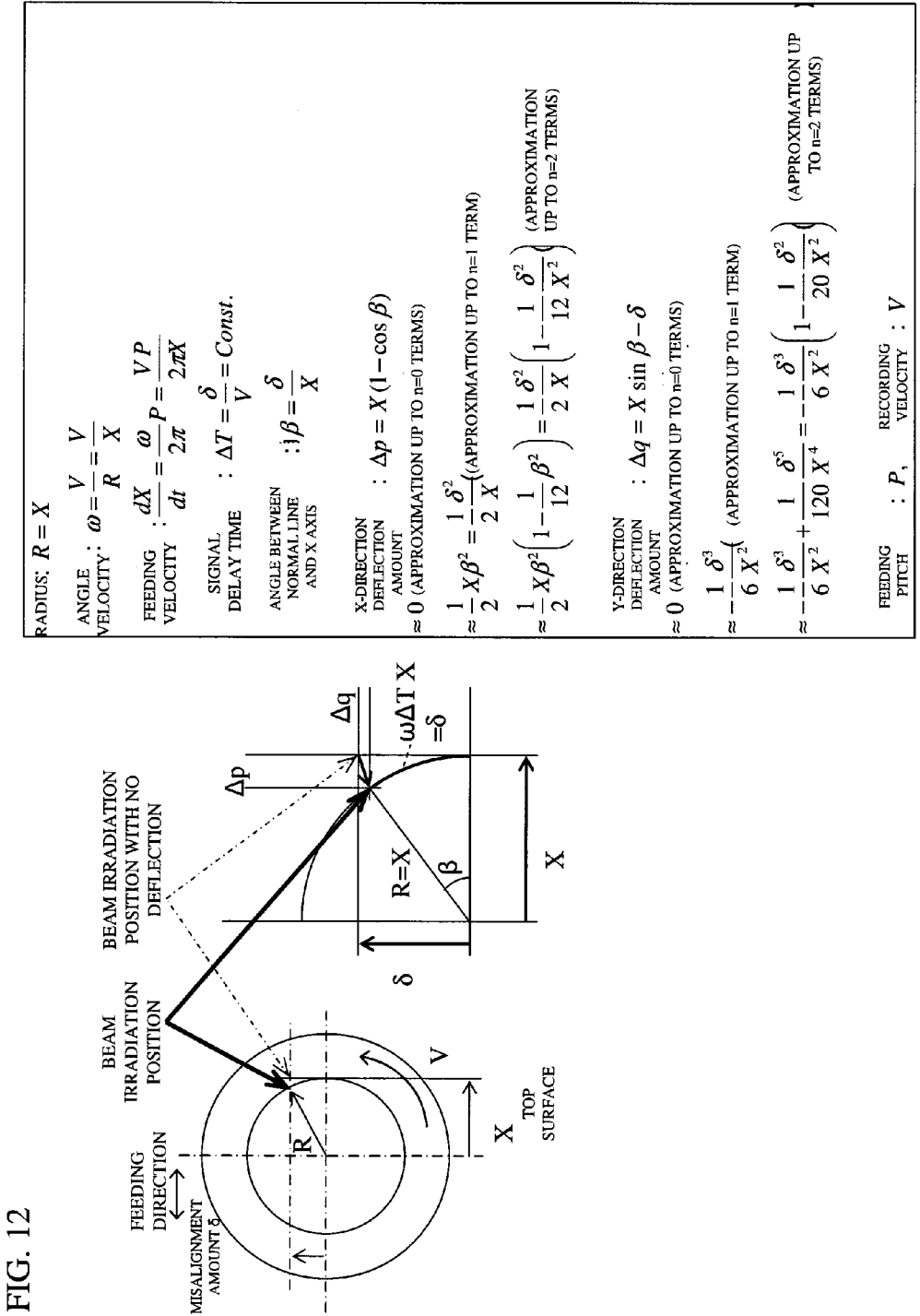
FIG. 12 is an explanatory diagram for describing compensation performed using simplified coordinate conversion and signal delay (fixed delay time) and XY-direction deflection.

(2) Compensation Using Simplified Coordinate Conversion/Signal Delay (Constant Delay Time) and XY Direction Deflection The inventors of the present invention found that, when performing recording using constant linear velocity (CLV), a comparably good match can be seen by combining the deflection in the XY directions, even if the coordinate conversion is simplified (using a constant delay time for the time coordinates). FIG. 12 is an explanatory diagram for describing compensation using this method.

In FIG. 12, for the coordinate system, a movement direction position X detected by the laser interference system 35 and a value of δ based on the characteristic information signal SC described above are used such that:

Radius $R=X$

For the angular velocity and the feeding velocity, the recording velocity is V, the movement pitch is P, such that:

Angular velocity $\omega=V/R=V/X$

Feeding velocity $DX/DT=(\omega/2\pi)P$ $=VP/2\pi X$

The conversion of spatial coordinates from an XY coordinate system (X,Y) to a radial direction coordinate system (R,θ) is thus performed. Conversion of the time coordinates (in this example, a delay process with a constant delay time) should be performed for the position in the θ direction. In other words, based on:

Angle β formed by a normal line and the X-axis=δ/X a signal delay time ΔT becomes:

$\Delta T = \delta/V$
$= CONST.$

The small portion remaining in this formula can be adjusted by the deflection in the XY directions (=irradiation position movement), and the X-direction deflection amount ΔP and the Y-direction deflection amount ΔQ can be compensated using the following approximation formulas.

In other words, if the approximation is up to N=0 terms, then the X-direction deflection amount ΔP becomes:

$\Delta P = X(1-\cos\beta)$ $\neq 0$

With an approximation up to N=1 term:

$\Delta P = X(1 - \cos\beta)$
$\neq (1/2)X\beta^2$
$= \delta^2/2X$

With an approximation up to N=2 terms:

$\Delta P = X(1 - \cos\beta)$
$\neq (1/2)X\beta^2(1 - \beta^2/12)$
$= (1/2X)\delta^2(1 - \delta^2/12X^2)$ If an approximation up to N=0 terms is used for the Y-direction deflection amount ΔQ:

$\Delta Q = X \sin\beta - \delta$ $\neq 0$

With an approximation up to N=1 term:

$$\Delta Q = X \text{SIN}\beta - \delta$$
$$\neq -(1/6)\delta^3/X^2$$

With an approximation up to N=2 terms:

$$\Delta Q = X \text{SIN}\beta - \delta$$
$$\neq -\delta^3/6X^2 + \delta^5/120X^4$$
$$= -\delta^3/6X^2(1-\delta^2/20X^2)$$

In the embodiment shown in FIG. 2, the record data RD is re-read and record data RDM is generated using the above method by the record signal compensation unit 47. In the modification shown in FIG. 7, the blanking control signal SB, the beam deflection signal VBEAM, and the substrate velocity signal VSUB are re-read and a blanking control signal SBM, a beam deflection signal VBEAMM, and a substrate velocity signal VSUBM are generated by the blanking signal compensation unit 148 and the deflection/substrate velocity signal compensation unit 147 using the above method.

In the record control signal generating apparatus 100 of the present modification, the first or second signal compensation unit 47, 147, and 148 perform compensation based on the characteristic information signal SC using a predetermined coordinate conversion process (in this example, simplified), the delay process of the timing of the blanking control using the deviation information signal in the blanking control unit 31, and an irradiation position movement computation process for the exposure beam by the beam deflection unit 33 in a mode in response to the coordination conversion process and the timing delay process, and in accordance with the compensation, the signal generating unit 30 comprising the first or second signal compensation unit 47, 147, and 148 generates the compensated signals (in this example, the beam deflection signal VBEAMM, the substrate velocity signal VSUBM, and the blanking control signal SBM) to the beam deflection unit 33, the substrate velocity adjustment unit 37A and 37B, and the blanking control unit 31.

With this arrangement, by converting to a coordinate of a different system in accordance with the misalignment deviation δ between the target irradiation position and the actual irradiation position which differs among individual units of the recording apparatus 10, delaying the timing of the blanking control for starting and stopping irradiation in accordance with the deviation δ, and further performing a computation process which moves the beam irradiation position according to these two processes, it is possible to generate the compensated control signals VBEAMM and VSUBM, and the blanking control signal SBM so as to absorb the errors in the individual units.

Note that, after the inventors used real values and performed some calculations for confirmation, the following were found to be effective:
ΔP: up to N=0 terms; ΔQ: up to N=0 terms (no deflection)
ΔP: up to N=1 term; ΔQ: up to N=0 terms (only X deflection compensated)
ΔP: up to N=1 term; ΔQ: up to N=1 term
ΔP: up to N=2 terms; ΔQ: up to N=1 term
ΔP: up to N=2 terms; ΔQ: up to N=2 terms (2') Compensation Using Unsimplified Coordinate Conversion/Signal Delay (Constant Delay Time) and XY Direction Deflection In the method described in (2) above, if, as in (1) above, the coordinate conversion is not simplified, and the movement direction position X detected by the laser interference system 35 and the value of δ based on the characteristic information signal SC described above are used, the conversion may be performed with:

Radius $R=(X^2+\delta^2)^{1/2}$

Figure 13:
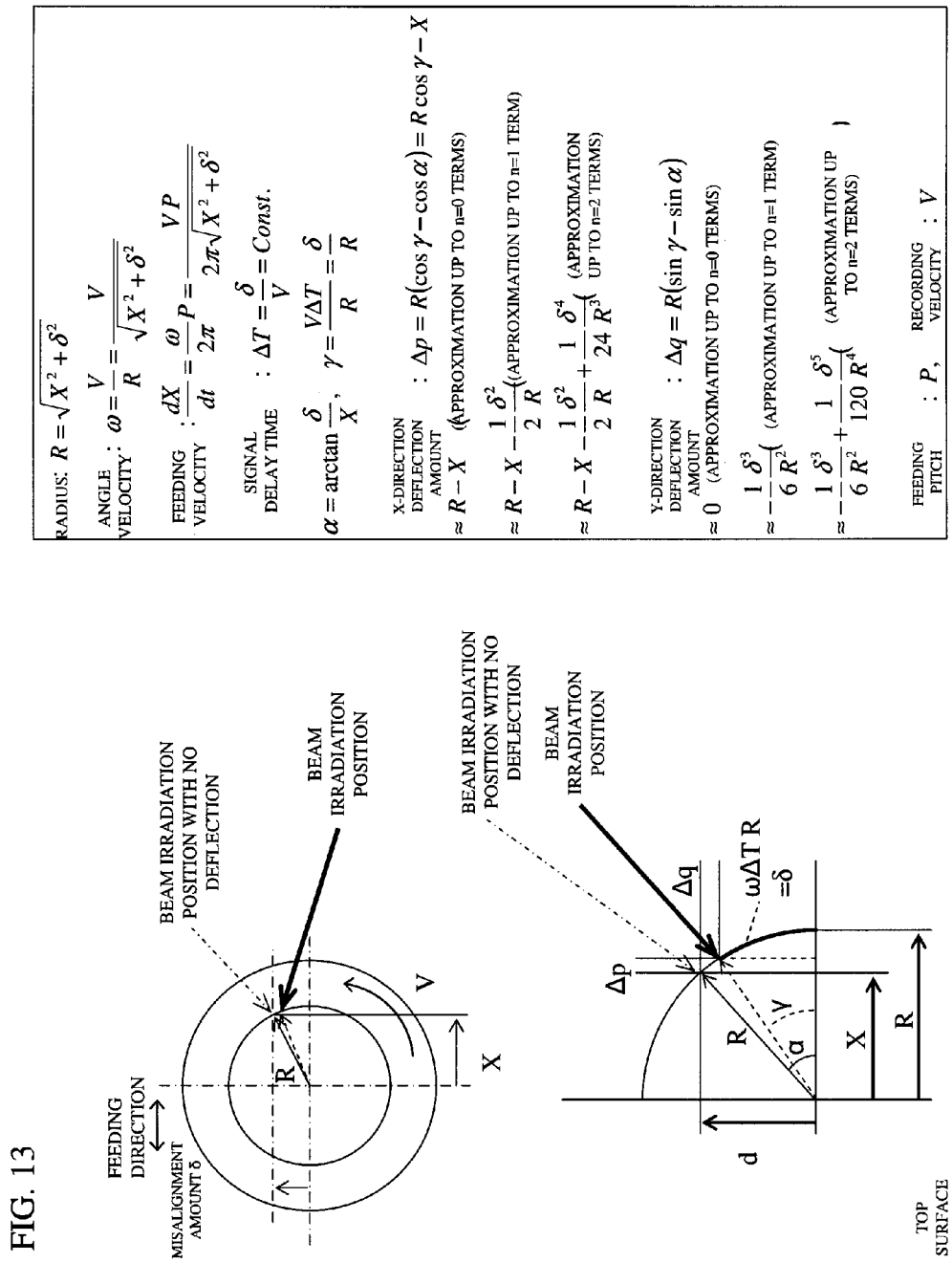
FIG. 13 is an explanatory diagram for describing compensation performed using unsimplified coordinate conversion and signal delay (fixed delay time) and XY-direction deflection.

FIG. 13 is an explanatory diagram for describing the compensation using this method.

In FIG. 13, regarding the coordinate system, as described above, the following is used:

Radius $R=(X^2+\delta^2)^{1/2}$

For the angular velocity and the feeding velocity, the recording velocity is V, and the movement pitch is P, such that:

Angular velocity $\omega=V/R=V/(X^2+\delta^2)^{1/2}$

Feeding velocity $DX/DT=(\omega/2\pi)P$ $=VP/\{2\pi(X^2+\delta^2)^{1/2}\}$

The conversion of spatial coordinates from an XY coordinate system (X,Y) to a radial direction coordinate system (R,θ) is thus performed. In such a case, conversion of the time coordinates (in this example, a delay process with a constant delay time) should be performed for the position in the θ direction. In other words, based on:

angle α formed by the beam irradiation position, when there is no deflection, and the X-axis α=ARCTAN(δ/X)
the signal delay time ΔT can be:

$$\Delta T = \delta/V$$
$$= CONST.$$

The small portion remaining in the above formulas is adjusted by the XY direction deflection (=irradiation position movement), and since the angle γ between the X-axis and the position to be irradiated by the beam after deflection is:

$$\gamma = V\Delta T/R$$
$$= \delta/R$$

the X-direction deflection amount ΔP and the Y-direction deflection amount ΔQ can be compensated using the following approximations formulas.

In other words, if the approximation is up to N=0 terms, then the X-direction deflection amount ΔP becomes:

$$\Delta P = R(\text{COS}\gamma - \text{COS}\alpha)$$
$$= R\text{COS}\gamma - X$$
$$\neq R - X$$

With an approximation up to N=1 term:

$$\Delta P = R(\cos\gamma - \cos\alpha)$$
$$\neq R - X - \delta^2/2R$$

With an approximation up to N=2 terms:

$$\Delta P = R(\cos\gamma - \cos\alpha)$$
$$\neq R - X - \delta^2/2R + \delta^4/24R^3$$

If an approximation up to N=0 terms is used for the Y-direction deflection amount $\Delta Q$:

$$\Delta Q = R(\sin\gamma - \sin\alpha)$$
$$\neq 0$$

With an approximation up to N=1 term:

$$\Delta Q = R(\sin\gamma - \sin\alpha)$$
$$\neq -\delta^3/6R^2$$

With an approximation up to N=2 terms:

$$\Delta Q = R(\sin\gamma - \sin\alpha)$$
$$\neq -\delta^3/6R^2 + \delta^5/120R^4$$

In the embodiment shown in FIG. 2, the record data RD is re-read and record data RDM is generated using the above method by the record signal compensation unit 47. In the modification shown in FIG. 7, the blanking control signal SB, the beam deflection signal VBEAM, and the substrate velocity signal VSUB are re-read and a blanking control signal SBM, a beam deflection signal VBEAMM, and a substrate velocity signal VSUBM are generated by the blanking signal compensation unit 148 and the deflection/substrate velocity signal compensation unit 147 using the above method.

In the record control signal generating apparatus 100 of the present modification, the first or second signal compensation unit 47, 147, and 148 perform compensation based on the characteristic information signal SC using a predetermined coordinate conversion process (in this example, unsimplified), the delay process of the timing of the blanking control using the deviation information signal in the blanking control unit 31, and the irradiation position movement computation process for the exposure beam using the beam deflection unit 33 in a mode in response to the coordination conversion process and the timing delay process, and in accordance with the compensation, the signal generating unit 30 comprising the first or second signal compensation unit 47, 147, and 148 generates the compensated signals (in this example, the beam deflection signal VBEAMM, the substrate velocity signal VSUBM, and the blanking control signal SBM) to the beam deflection unit 33, the substrate velocity adjustment unit 37A and 37B, and the blanking control unit 31.

With this arrangement, by converting to a coordinate of a different system in accordance with the misalignment deviation δ between the target irradiation position and the actual irradiation position which differs among individual units of the recording apparatus 10, delaying the timing of the blanking control for starting and stopping irradiation in accordance with the deviation δ and further performing a computation process which moves the beam irradiation position according to these two processes, it is possible to generate the compensated control signals VBEAMM and VSUBM, and the blanking control signal SBM so as to absorb the errors in the individual units.

Note that in the case described above, compared to the method in (2) above, calculation becomes rather complex since the coordinate conversion is not simplified, but when the inventors used actual values and considered the outcome, the absolute values of the deflection amounts ($\Delta P$ and $\Delta Q$) were smaller than using the method in (2), and it was found that deterioration of the beam due to deflection was hard to occur.

(3) The Value of δ is Negative

In (1), (2), and (2') above, examples were explained in which the misalignment amount δ shown in FIG. 8 to FIG. 12 was positive in the shown coordinate system, but this is not a limitation, and a case in which a negative value of the misalignment amount δ is also possible.

Figure 14:
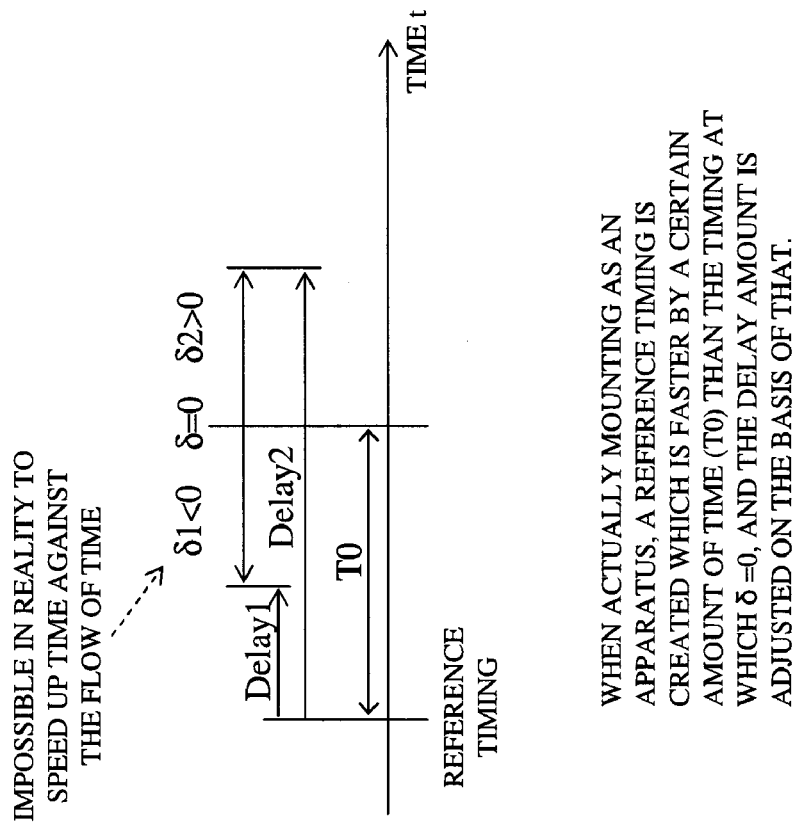
FIG. 14 is an explanatory diagram showing the concept of compensation in a case in which the misalignment amount is a negative value.

FIG. 14 is an explanatory diagram for describing the concept of compensation in this case. As shown in the diagram, in this case, compensation is performed by speeding up the signal output timing, which is in principle the opposite of compensation by delaying the signals. In reality, however, since it is naturally impossible to speed up the timing by reversing the flow of time, a reference timing should be set at a timing which is faster by a fixed amount of time (T0) than the timing at which δ=0, and adjustment is made using a delay amount (indicated by "DELAY" in the drawing) from that point. In other words, in the cases in which δ>0 as described in (1), (2), and (2') above, compensation is performed using a time elapsed by a delay amount "DELAY2" which is relatively larger than the reference timing, but in a case in which δ<0, compensation is performed using a time elapsed by a delay amount "DELAY1" which is relatively smaller than the reference timing.

(4) Other

The above description was given using as an example a case in which the misalignment amount δ between the beam irradiation position and the center of rotation when the X stage 18 is moved in the X direction is compensated based on the record signal RD and the characteristic information signal SC, but this is not a limitation, and compensation of other errors (mechanical errors) which occur in individual recording apparatus 10 due to dimensional errors and assembly errors, and the like in component parts of the beam recording apparatus 10 is also possible. For example, the following is also possible.

(4-1) Rotational Irregularities in the θ Stage

Specifically, in a case in which rotational irregularities (non-uniformity) of the turntable 16 occur due to the spindle motor 17, compensation in response to the rotational irregularities may be executed using a method for changing the clock, and the like, by inputting into the formatter 100 an angle position detection signal of the turntable 16 (in other words, the substrate 15) based on the rotation signal of the spindle motor input to the stage rotation and feeding driving units 37A and 37B.

(4-2) Rotational Eccentricity in the θ Stage

Specifically, in a case in which rotational eccentricity of the rotating shaft occurs in the rotation of the turntable 16 by the spindle motor 17, compensation in response to the rotational eccentricity may be executed using, for example, a method superimposing a compensated amount on the beam deflection amount in the X direction in the beam deflection unit 33, and the like, by inputting into the formatter 100 an angle position detection signal of the turntable 16 (in other words, the substrate 15) based on the rotation signal of the spindle motor 17 input to the stage rotation and feeding driving units 37A and 37B.

(4-3) Height Position Fluctuation of the X Stage Due to Pitching

Specifically, in a case in which pitching occurs such as tilting in the movement direction (forwarding pitching, or the opposite thereof), and the like, in the translational movement of the X stage 18 by the movement motor 19, compensation can be executed using, for example, a method for height compensation via the focus control unit 34, by inputting into the formatter 100 an angle position detection signal of the turntable 16 (in other words, the substrate 15) based on the rotation signal of the spindle motor 17 input into the stage rotation and feeding driving units 37A and 37B or a position detection signal of the X stage based on movement position data from the laser interference system 35 input to the stage rotation and feeding driving units 37A and 37B.

(4-4) Error in X-Direction Position Due to Pitching of the X Stage

Specifically, in a case in which pitching occurs such as tilting in the movement direction (forwarding pitching, or the opposite thereof), and the like, in the translational movement of the X stage 18 by the movement motor 19, compensation may be executed in response to the errors in the X-direction position using, for example, a method such as superimposing the compensated amount on the deflection amount in the X direction in the beam deflection unit 33, by inputting into the formatter 100 a position detection signal of the X stage 18 based on the movement position data from the laser interference system 35 input into the stage rotation and feeding driving units 37A and 37B.

(4-5) Error in Y-Direction Position Due to Rolling of the X Stage (Part 1)

Specifically, in a case in which rolling occurs such as tilting to the left and right directions (lateral wobbling), and the like, in the translational movement of the X stage 18 by the movement motor 19, compensation can be executed using, for example, a method for adjusting the delay time in the delay process described above, by inputting into the formatter 100 an angle position detection signal of the turntable 16 (in other words, the substrate 15) based on the rotation signal of the spindle motor 17 input into the stage rotation and feeding driving units 37A and 37B or a position detection signal of the X stage based on movement position data from the laser interference system 35 input to the stage rotation and feeding driving units 37A and 37B.

(4-6) Error in Y-Direction Position Due to Rolling of the X Stage (Part 2)

In a case in which the same rolling as above occurs, compensation may be executed in response to the errors in the θ (Y) direction position by using, for example, a method for superimposing the compensated amount onto the deflection amount in the Y direction in the beam deflection unit 33, by inputting into the formatter 100 an angle position detection signal of the turntable 16 (in other words, the substrate 15) based on the rotation signal of the spindle motor 17 input into the stage rotation and feeding driving units 37A and 37B or a position detection signal of the X stage based on movement position data from the laser interference system 35 input to the stage rotation and feeding driving units 37A and 37B.

(4-7) Error in θ-Direction Position Due to Yawing of the X Stage (Part 1)

Specifically, in a case in which yawing, which is wobbling of the movement-direction shaft line, occurs in the translational movement of the X stage 18 by the movement motor 19, compensation can be executed using, for example, a method for adjusting the delay time in the delay process described above, by inputting into the formatter 100 an angle position detection signal of the turntable 16 (in other words, the substrate 15) based on the rotation signal of the spindle motor 17 input into the stage rotation and feeding driving units 37A and 37B or a position detection signal of the X stage based on movement position data from the laser interference system 35 input to the stage rotation and feeding driving units 37A and 37B.

(4-8) Error in θ-Direction Position Due to Yawing of the X Stage (Part 2)

In a case in which the same yawing as above occurs, compensation may be executed in response to the errors in the Y-direction position by using, for example, a method for superimposing the compensated amount onto the deflection amount in the Y direction in the beam deflection unit 33, by inputting into the formatter 100 an angle position detection signal of the turntable 16 (in other words, the substrate 15) based on the rotation signal of the spindle motor 17 input into the stage rotation and feeding driving units 37A and 37B or a position detection signal of the X stage based on movement position data from the laser interference system 35 input to the stage rotation and feeding driving units 37A and 37B.

(4-9) Height Measurement Error Due to Pressure Fluctuation

Specifically, in a case in which measurement errors occur due to pressure fluctuation in a substrate height detection signal from the optical detection unit 36B input into the focus control unit 34, compensation may be executed in response to the errors in the height position using a method such as for superimposing the compensated amount on a height adjustment amount via the focus control unit 34, by inputting into the formatter 100 the substrate height detection signal from the optical detection unit 36B input into the focus control unit 34.

(4-10) Error in Beam Position/Height Position Due to Temperature Fluctuation

Specifically, a sensitivity (correlation) of fluctuation in beam position (X-direction or Y-direction) and height position to the ambient temperature of the electron beam recording apparatus 10 is found ahead of time, and the sensitivity is input and set in the formatter 100 as the characteristic information signal SC. Subsequently, compensation may be executed in response to the errors in the X-direction or Y-direction position using a method such as for superimposing a compensated amount based on the ambient temperature on the deflection amount in the X-direction or Y-direction in the beam deflection unit 33 by inputting a temperature signal corresponding to the ever-changing temperature into the formatter 100, or alternately, compensation may be executed in response to the errors in the height position using a method such as for superimposing a compensated amount based on the ambient temperature on the height adjustment amount via the focus control unit 34. Further, rather than using the temperature at one point, it is also possible here to consider the temperature at a plurality of points for calculation and compensation.

(4-11) Error in Beam Position/Height Position Due to Acoustic Vibration

Specifically, a sensitivity (correlation) of fluctuation in beam position (X-direction or Y-direction) and height position to the ambient acoustic vibration of the electron beam recording apparatus 10 is found ahead of time, and this is input and set in the formatter 100 as the characteristic information signal SC. Subsequently, compensation may be executed in response to the errors in the X-direction or Y-direction position using a method such as for superimposing a compensated amount based on the ambient acoustic vibration on the deflection amount in the X-direction or Y-direction in the beam deflection unit 33 by inputting an acoustic vibration signal corresponding to the ever-changing ambient acoustic vibration into the formatter 100, or alternately, compensation may be executed in response to the errors in the height position using a method such as for superimposing a compensated amount based on the acoustic vibration on the height adjustment amount via the focus control unit 34. Further, rather than using the acoustic vibration at one point in one direction, it also possible here to consider the acoustic vibration at a plurality of points in a plurality of directions for calculation and compensation.

(4-12) Error in Beam Position/Height Position Due to Magnetic Field Fluctuation

Specifically, a sensitivity (correlation) of fluctuation in beam position (X-direction or Y-direction) and height position to the ambient magnetic field fluctuation of the electron beam recording apparatus 10 is found ahead of time, and this is input and set in the formatter 100 as the characteristic information signal SC. Subsequently, compensation may be executed in response to the errors in the X-direction or Y-direction position using a method such as for superimposing a compensated amount based on the magnetic field fluctuation on the deflection amount in the X-direction or Y-direction in the beam deflection unit 33 by inputting a magnetic field signal corresponding to the ever-changing ambient magnetic field into the formatter 100, or alternately, compensation may be executed in response to the errors in the height position using a method such as for superimposing a compensated amount based on the magnetic field fluctuation on the height adjustment amount via the focus control unit 34. Further, rather than using the magnetic field fluctuation in one direction at one point, it also possible here to consider the magnetic field fluctuation in a plurality of directions at a plurality of points for calculation and compensation.

(4-13) Positional Misalignment of Placement of the Substrate

Specifically, placement of each substrate 15 on the turntable 16 varies, strictly speaking. Accordingly, compensation may be executed in response to the placement position misalignment using a method such as for superimposing the compensation amount on the deflection amount in the X and Y directions in the beam deflection unit 33 or for adjusting the delay time in the delay process described above in accordance with the position in the rotation direction (or the movement direction), by inputting into the formatter 100 placement position misalignment information as characteristic information (specifically, eccentric amount or eccentric orientation, and the like) and the angle position detection signal of the turntable 16 (in other words, the substrate 15) based on the rotation signal of the spindle motor 17 input into the stage rotation and feeding driving units 37A and 37B (or the position detection signal of the X stage 18 based on the movement position data from the laser interference system 35 input into the stage rotation and feeding driving units 37A and 37B).

Note that a recording system S may be constituted such that of the formatter 100 or 100A described above, at least the signal generating unit 30 maybe provided to the electron beam recording apparatus 10. Alternately, it may be provided so as to straddle both the formatter 100 or 100A and the electron beam recording apparatus 10 (one part to the formatter 100 or 100A and another part to the electron beam recording apparatus 10).

In this case, the recording system S comprises: a recording apparatus 10 comprising: a beam deflection unit (in this example, the beam deflection unit) 33 that moves an irradiation position of the exposure beam relative to the substrate 15 on which a resist layer has been formed, a substrate velocity adjustment unit (in this example, the rotation and feeding driving units) 37A and 37B that adjusts a tangential direction or radial direction moving velocity of the substrate 15, and a blanking control unit (in this example, the blanking control unit) 31 that performs blanking control of irradiation of the exposure beam, the recording apparatus 10 (in this example, the electron beam recording apparatus) forming a latent image on the resist layer by irradiating the exposure beam on a resist layer with the beam deflection unit 33 while moving the substrate 15 at the tangential direction or radial direction moving velocity adjusted by substrate velocity adjustment unit 37A and 37B; and a record signal generating apparatus 100 that generates and outputting to the recording apparatus 10 a control signal for forming a latent image; wherein: at least one of the recording apparatus 10 or the record signal generating apparatus 100 is provided with a signal generating unit (in this example, the signal generating unit) 30 that generates a compensated control signal (in this example, the beam deflection signal VBEAMM and the substrate velocity signal VSUBM) to at least one of the beam deflection unit 33 and the substrate velocity adjustment unit 37A and 37B according to the record signal RD (in this example, the record data RD) and the characteristic information signal SC (in this example the misalignment amount δ) of the recording apparatus 10.

In this recording system S, the signal generating unit 30 provided to either the recording apparatus 100 or the record control signal generating apparatus 100, generates a compensated control signal (in this example, the beam deflection signal VBEAM and the substrate velocity signal VSUBM) to at least the beam deflection unit 33 and the substrate velocity adjustment unit 37A and 37B in accordance to the record signal RD and the characteristic information signal SC as the compensation element.

With this arrangement, it is thus possible to generate the compensated control signals VBEAMM and VSUBM which have been subjected to compensation matching the errors of each unit, in response to the errors (mechanical errors) based on assembly dimension precision of each part and control precision of control devices which can vary from unit to unit of the recording apparatus 10, and output the compensated control signals to corresponding units. As a result, the corresponding recording apparatus 10 which has input the compensated control signals VBEAMM and VSUBM can perform a high-precision recording operation with reduced (or eliminated) errors. Further, in a case in which error characteristics may differ from day to day even within the same recording apparatus 10, it is possible to accurately accommodate those changing characteristics and perform high-precision recording operations.

Further, even if errors are not taken into consideration, it is also possible to provide to each of a plurality of types of the recording apparatus 10, which have a common control mode in base portions but differing control modes in other portions, a common control program corresponding to the base portions, and input compensated control signals from the signal generating unit 30 to each of the recording apparatus 10, by considering the content of control programs corresponding to the other portions as the characteristics of the recording apparatus 10 and as the compensation element. In this case, it is enough to prepare only one common control program for the plurality of types of the recording apparatus 10, therefore making it possible to simplify and streamline the control constitution and control program and reduce manufacturing costs.

In the recording system S, the signal generating unit 30 comprises a first signal compensation unit (in this example, the record signal compensation unit) 47 that compensates the record signal RD based on the characteristic information signal SC, and a first deflection substrate control signal generating unit (in this example, deflection/substrate velocity signal generating unit) 41 that generates the compensated control signals VSUBM and VBEAMM to the beam deflection unit 33 and the substrate velocity adjustment unit 37A and 37B according to the record signal RD compensated by the first signal compensation unit 47.

By using a constitution in which the record signal RD is compensated by the first signal compensation unit 47 and then supplied to the first deflection/substrate velocity signal generating unit 41, the only signal that needs to be compensated is the record signal RD only, making it possible to achieve a simplified control constitution.

In the recording system S, the signal generating unit 30 generates as the characteristic information signal the compensated control signals VSUBM and VBEAMM according to an error information signal SC corresponding to error information (in this example, the misalignment amount δ) based on the dimensional precision and control precision of the recording apparatus 10.

By generating a compensated signal to the beam deflection unit 33 and the substrate velocity adjustment unit 37A and 37B with the signal generating unit 30 according to the record signal RD and the error information signal SC as the compensation element, the compensated control signals VSUBM and VBEAMM can be generated which matches the error of each unit, in response to the errors (mechanical errors) based on assembly dimension precision of parts and control precision of control devices which can vary from unit to unit in the recording apparatus 10.

In the recording system 30, the signal generating unit 30 generates the compensated control signals VSUBM and VBEAMM in response to the deviation information signal SC corresponding to a deviation (in this example, the misalignment amount δ) between a target irradiation position and an actual irradiation position by the exposure beam as the error information signal.

As a result, it is possible to generate the compensated control signals VSUBM and VBEAMM which matches the error of each unit, in response to the misalignment deviation between the target irradiation position and the actual irradiation position based on the assembly dimension precision of parts and the control precision of the control devices which varies among individual units of the recording apparatus 10.

In the case of the constitution shown in FIG. 7, the recording system S comprises: a recording apparatus 10 comprising: a beam deflection unit 33 that moves an irradiation position of a exposure beam relative to a substrate 15 on which a resist layer is formed, substrate velocity adjustment unit 37A and 37B that adjusts a tangential direction or radial direction moving velocity of the substrate 15, and a blanking control unit 31 that performs blanking control of irradiation of the exposure beam, the recording apparatus 10 forming a latent image on the resist layer by irradiating the exposure beam whose irradiation position is moved by the beam deflection unit 33 on the resist layer while moving the substrate 15 at the tangential direction or radial direction moving velocity adjusted by the substrate velocity adjustment unit 37A and 37B; and a record control signal generating apparatus 100A that generates and outputting to the recording apparatus 10 a control signal for forming the latent image; wherein: at least one of the recording apparatus 10 and the record control signal generating apparatus 100A comprises a signal generating unit 30 that generates compensated control signals VBEAMM and VSUBM to at least the beam deflection unit 33 and the substrate velocity adjustment unit 37A and 37B of the recording apparatus 10 according to a record signal RD and a characteristic information signal SC as a signal compensation element corresponding to characteristic information of the recording apparatus 10.

In this recording system S, the signal generating unit 30 provided to at least one of the recording apparatus 10 and the record control signal generating apparatus 100A generates the compensated control signals VBEAM and VSUBM to at least the beam deflection unit 33 and the substrate velocity adjustment unit 37A and 37B in accordance to the record signal RD and the characteristic information signal SC of the recording apparatus 10 as the compensation element.

With this arrangement, it is possible to generate the compensated control signals VBEAMM and VSUBM which have been subjected to compensation matching the errors of each unit, in response to the errors (mechanical errors) based on assembly dimension precision of each part and control precision of control devices which can vary from unit to unit of the recording apparatus 10, and output the compensated control signals to corresponding units. As a result, the corresponding recording apparatus 10 which has input the compensated control signals VBEAMM and VSUBM can perform a high-precision recording operation with reduced (or eliminated) errors. Further, in a case in which error characteristics may differ from day to day even within the same recording apparatus 10, it is possible to accurately accommodate those changing characteristics and perform high-precision recording operations.

Further, even if errors are not taken into consideration, it is also possible to provide to a plurality of types of the recording apparatus 10, which have a common control mode in base portions but differing control modes in other portions, a common control program corresponding to the base portions, and input compensated control signals from the signal generating unit 30 to the recording apparatus 10, by considering the content of control programs corresponding to the other portions as the characteristics of the recording apparatus 10 and as the compensation element. In this case, it is enough to prepare only one common control program for the plurality of types of the recording apparatus 10, therefore making it possible to simplify and streamline the control constitution and control program and reduce manufacturing costs.

In the recording system S, the signal generating unit 30 comprises a second deflection substrate control signal generating unit 41A that generates the basic control signals VSUB and VBEAM to the beam deflection unit 33 and the substrate velocity adjustment unit 37A and 37B in accordance with the record signal RD, and a second compensation unit 147 that compensates the basic control signals VSUB and VBEAM generated by the second deflection substrate control signal generating unit 41A based on the characteristic information signal SC and generating compensated control signals VSUB and VBEAMM.

By using a constitution in which the basic control signals VSUB and VBEAM are created by the second deflection substrate control signal generating unit 41A from the record signal RD, supplying the basic control signals to the second signal compensation unit 147, and then compensating these signals, it is possible to improve the corrective effect of compensation because the compensation is performed immediately before the final output.

The above description was given using as an example a beam recording apparatus using an Xθ stage system, but this is not a limitation, and the present invention can also be applied to a beam recording apparatus provided with an XY stage system.

Further, a beam recording apparatus using an electron beam was described above, but the present invention can also be applied to a laser beam recording apparatus or other electrically charged particle beam recording apparatus provided with a deflection apparatus.

The formatter 100 according to the present embodiment that generates and outputting to a recording apparatus 10 a control signal for forming a latent image, comprises: an interface that inputs record data RD; an interface that inputs a characteristic information signal SC corresponding to the characteristic information (in this example, the misalignment amount δ) of the electron beam recording apparatus 10 as a signal compensation element; and a signal generating unit 30 that generates a beam deflection signal VBEAMM and a substrate velocity signal VSUBM to at least a beam deflection unit 33 and rotation and feeding driving units 37A and 37B according to the record signal RD input by the interface and the characteristic information signal SC input by the interface, wherein the recording apparatus 10 comprises: the beam deflection unit 33 that moves an irradiation position of the exposure beam relative to a substrate 15 on which a resist layer has been formed, the rotation and feeding driving units 37A and 37B that adjusts a tangential direction or radial direction moving velocity of the substrate 15, and a blanking control unit 31 that performs blanking control of irradiation of the exposure beam, the recording apparatus 10 forming a latent image on the resist layer by irradiating the exposure beam on the resist layer with the beam deflection unit 33 while moving the substrate 15 at the tangential direction or radial direction moving velocity adjusted by the rotation and feeding driving units 37A and 37B.

With this arrangement, it is possible to generate the beam deflection signal VBEAMM and the substrate velocity signal VSUBM which have been subjected to compensation matching the errors of each unit, in response to the errors (mechanical errors) based on assembly dimension precision of each part and control precision of control devices which can vary from unit to unit of the electron beam recording apparatus 10, and output these compensation signals to corresponding units. As a result, the corresponding electron beam recording apparatus 10 which has input the signals VBEAMM and VSUBM can perform a high-precision recording operation with reduced (or eliminated) errors. Further, in a case in which the error characteristics may differ from day to day even within the same electron beam recording apparatus 10, it is possible to accurately accommodate those changing characteristics and perform high-precision recording operations.

The recording system S provided with the record signal generating apparatus 100 according to the present embodiment comprising an electron beam recording apparatus 10 and a formatter 100 for generating and outputting to the electron beam recording apparatus 10 a control signal for forming a latent image, comprises a signal generating unit 30 disposed on at least one of the electron beam recording apparatus 10 and the formatter 100, for generating a beam deflection signal VBEAMM and a substrate velocity signal VSUBM to at least a beam deflection unit 33 and rotation and feeding driving units 37A and 37B of the electron beam recording apparatus 10 according to record data RD and a characteristic information signal SC as a signal compensation element corresponding to a misalignment amount δ of the electron beam recording apparatus 10; wherein the electron beam recording apparatus 10 comprises: the beam deflection unit 33 that moves an irradiation position of an exposure beam relative to a substrate 15 on which the resist layer is formed, the rotation and feeding driving units 37A and 37B that adjusts a tangential direction or radial direction moving velocity of the substrate 15, and a blanking control unit 31 that performs blanking control of irradiation of the exposure beam, the electron beam recording apparatus 10 forming the latent image on the resist layer by irradiating the exposure beam whose irradiation position is moved by the beam deflection unit 33 on the resist layer while moving the substrate 15 at the tangential direction or radial direction moving velocity adjusted by the rotation and feeding driving units 37A and 37B.

With this arrangement, it is possible to generate the beam deflection signal VBEAMM and the substrate velocity signal VSUBM which have been subjected to compensation matching the errors of each unit, in response to the errors (mechanical errors) based on assembly dimension precision of each part and control precision of control devices which can vary from unit to unit of the electron beam recording apparatus 10, and output the compensated signals to corresponding units. As a result, the corresponding electron beam recording apparatus 10 which has input the signals VBEAMM and VSUBM can perform a high-precision recording operation with reduced (or eliminated) errors. Further, in a case in which error characteristics may differ from day to day even within the same electron beam recording apparatus 10, it is possible to accurately accommodate those changing characteristics and perform high-precision recording operations.

The electron beam recording apparatus 10 and the record control signal generating apparatus 100 for manufacturing a master disk on which is formed a recording pattern of an optical disk have been described, but the present embodiment can also be applied when manufacturing so-called discrete track media or pattern record media (patterned media) in which the recorded magnetic substrates are spatially separated.

In other words, in the above description, a pattern recording method using the electron beam recording apparatus 10 was described for manufacturing groove shapes on discrete track media or dot shapes on pattern record media.

The electron beam recording apparatus 10 described above is an X-θ type electron beam recording apparatus that comprises a mechanism (corresponding to the X stage 18, and the like) for moving the substrate to which a resist is applied (corresponding to the substrate 15) and a rotating stage (corresponding to the turntable 16) for rotating the substrate, and that performs recording by irradiating an electron beam on the resist.

Using this electron beam recording apparatus 10, a dot pattern is formed by recording at set intervals while rotating and simultaneously moving the stage in the radial direction. On this occasion, it is possible to provide a spiral dot string without deflecting the electron beam during rotations, but as is disclosed in JP, A, 2002-367241, it is also possible to record concentric dot strings by performing irradiation with gradually varying the deflection amount of the electron beam in a saw tooth pattern so as to record a concentric circle on the resist in a single rotation. Besides dot patterns for data, it is also possible to create areas to which servo patterns are provided for extracting addresses or controlling track position.

Figure 15:
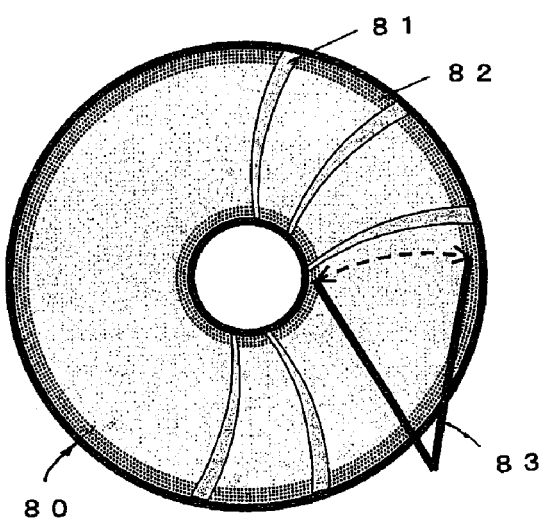
FIG. 15 is a plane view showing one example of a patterned magnetic recording medium manufactured using an imprint mold.

Ordinarily, patterned magnetic recording media are called hard disks or patterned media, or patterned hard disks. The patterned magnetic recording medium 80 shown in FIG. 15 can be divided into a servo pattern part 81 and a patterned data track part 82. Note that in the example in the drawing, the dot pattern of the data track part 82 is only shown in the outer circumference and inner circumference parts, but the drawing is deformed and abbreviated, and in actuality the dot pattern of the data track part 82 is present over the entire effective radius of the disk. The servo pattern part 81 is also present in parts other than those shown in the drawing.

A swinging arm head 83 is constituted so as to be swingable in the radial direction of a magnetic recording medium 80, and reads and writes data recorded on magnetic recording areas of the magnetic recording medium 80.

In the data track part 82, a recording medium pattern of a dot string arranged in a concentric circle is formed. A square-shaped pattern indicating address information and track detection information, a line-shaped pattern extending in the radial direction and cutting across the track for extracting clock timing, and so on are formed in the servo pattern part 81. The servo pattern part 81 has the same pattern as current hard disk recording media, but it is also possible to adopt a pattern shape or feature different from current hard disk media by adopting a servo pattern with a new format optimized for the patterned media.

It is necessary to record with differing recording pattern densities in the various areas in order to form patterns in the servo pattern part 81 and the data track part 82 using the electron beam recording apparatus 10. In a case in which a pattern is formed using conventional blanking, the length (time) of blanking per unit length (time) in the tangential direction differs between the servo pattern part 81 and the data track part 82. For example, if the tangential direction in the servo pattern part 81 has 40% blanking, and the data track part 82 has 60% blanking, the servo pattern part 81 is relatively denser in the tangential direction and the data track part 82 is relatively sparser in the tangential direction. Accordingly, patterns can be formed using a method in which recording velocity is fixed, or a method in which recording velocity varies.

However, this does not negate the applicability of the modifications described above. Neither does this negate performing record control corresponding to the various densities of the area indicating the track address in the control signal part, the area in which the track servo signal is obtained, the area for extracting the recording playback clock, and other finer areas.

Next an imprint mold (mold) manufacturing method for imprinting used in manufacturing pattern recording media is described.

1. Manufacturing Method for an Imprint Mold (So-Called Mold) for Imprinting

This manufacturing method constitutes the first half of a method for manufacturing a pattern recording medium by using a resist mask to first manufacture an imprint mold for imprinting, and then using this imprint mold for imprinting to perform transcription. The manufacturing method for a pattern recording medium using this imprinting method has high mass-production efficiency and can be used in a mass-production process since there is no need for recording or exposure for every individual medium compared to a method for directly etching a record coat layer (record material) formed on a base substrate for a magnetic recording medium.

<Manufacturing Method for an Imprint Mold for Imprinting>

The present example of application describes a specific example of a manufacturing method for an imprint mold for imprinting. Note that in the present example of application; the imprint mold for imprinting is manufactured using the electron beam recording apparatus 10. This example of application is an embodiment for manufacturing a patterned magnetic recording medium as an example of the magnetic recording media manufactured by this imprint mold for imprinting.

FIG. 16 to FIG. 21 show cross-section diagrams of one example of manufacturing the imprint mold for imprinting by using the present example of application.

Figure 16:
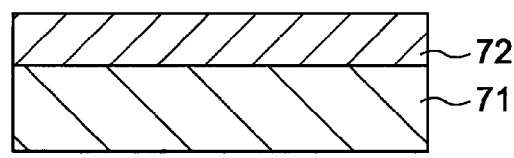
FIG. 16 is a cross-section diagram showing one example of a manufacturing method for an imprint mold for imprinting.

First, a glass or silicon (SI) wafer of an appropriate size is prepared as a substrate 71. Next, as shown in FIG. 16, a resist material needed for patterning is formed in a coat on the substrate 71 by spin coating or a similar method. In the present example of application, an electron beam resist film 72 is formed in order to perform exposure using the electron beam recording apparatus 10. Next, the electron beam resist film 72 is pre-baked as needed.

Figure 17:
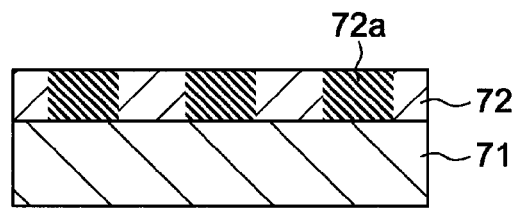
FIG. 17 is a cross-section diagram showing one example of a manufacturing method for an imprint mold for imprinting.
Figure 18:
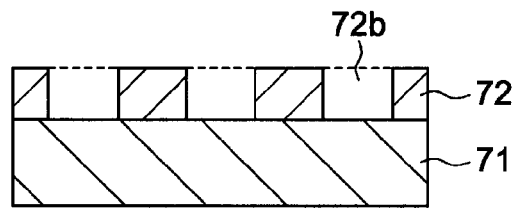
FIG. 18 is a cross-section diagram showing one example of a manufacturing method for an imprint mold for imprinting.

Next, the electron beam recording apparatus 10 according to the above embodiment records by exposing using the electron beam as shown in FIG. 17, forming a latent image 72A on the electron beam resist film 72 (latent image formation). Next, post-exposure baking (PEB) is performed as needed. When the electron beam resist film 72 is developed, a groove part 72B is formed on the electron beam resist film 72 as shown in FIG. 18. Thereafter, the electron beam resist film 72 is post-baked as needed.

Figure 19:
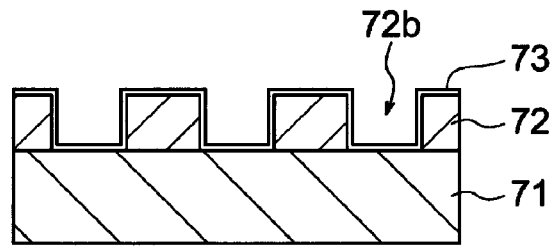
FIG. 19 is a cross-section diagram showing one example of a manufacturing method for an imprint mold for imprinting.

Next, a nickel alloy film 73 is formed on the electron beam resist film 72 and the substrate 71 surface by sputtering nickel as an initial conductive film as shown in FIG. 19 using a sputtering apparatus which is not shown.

Figure 20:
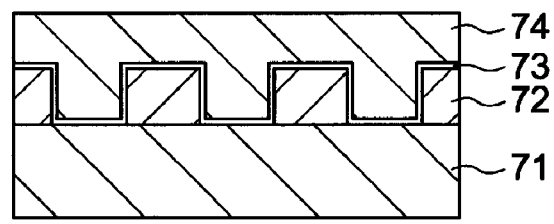
FIG. 20 is a cross-section diagram showing one example of a manufacturing method for an imprint mold for imprinting.
Figure 21:
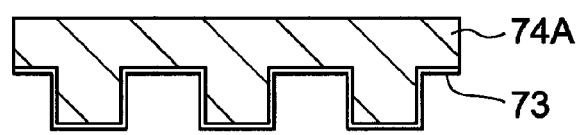
FIG. 21 is a cross-section diagram showing one example of a manufacturing method for an imprint mold for imprinting.

Next, a nickel layer 74 (imprint mold base) is formed on the surface of the nickel alloy film 73 by performing electro-forming (electrical plating) using the nickel alloy film 73 as an electrode as shown in FIG. 20. A master stamper 74A (imprint mold for imprinting) of a nickel and the like, is obtained as shown in FIG. 21 by releasing the nickel layer 74 from the substrate 71. At this point, the surface of the master stamper 74A is washed as needed.

<Another Manufacturing Method for an Imprint Mold for Imprinting>

FIG. 22 to FIG. 26 show cross-section diagrams of one example of manufacturing the imprint mold for imprinting according to another mode of the present example of application. Note that FIG. 22 to FIG. 26 show manufacturing processes which substitute that shown in FIG. 19 to FIG. 21 respectively.

Figure 22:
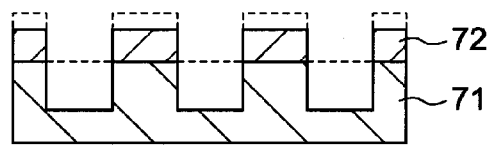
FIG. 22 is a cross-section diagram showing one example of a manufacturing method for an imprint mold for imprinting.
Figure 23:
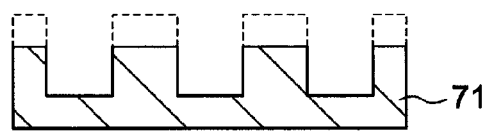
FIG. 23 is a cross-section diagram showing one example of a manufacturing method for an imprint mold for imprinting.

When the groove part 72B is formed on the electron beam resist film 72 as shown in FIG. 18, the substrate 71 (substrate material) as shown in FIG. 22 is etched using the resist pattern constituted by the electron beam resist film 72 as shown in FIG. 18 as the master. Next, the remaining electron beam resist film 72 is removed using oxygen plasma ashing, thus exposing the substrate 71 as shown in FIG. 23.

Figure 24:
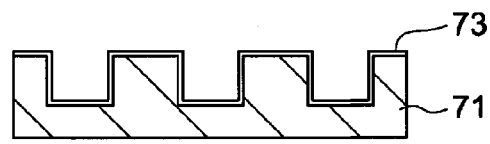
FIG. 24 is a cross-section diagram showing one example of a manufacturing method for an imprint mold for imprinting.
Figure 25:
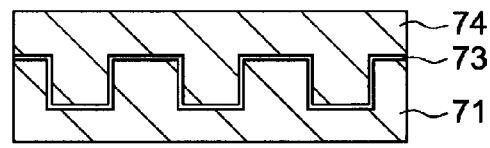
FIG. 25 is a cross-section diagram showing one example of a manufacturing method for an imprint mold for imprinting.
Figure 26:
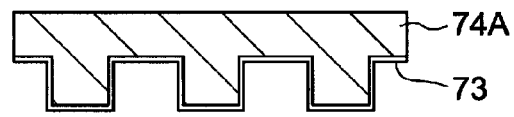
FIG. 26 is a cross-section diagram showing one example of a manufacturing method for an imprint mold for imprinting.

Next, a nickel alloy film 73 is formed on the exposed substrate 71 surface by sputtering nickel as an initial conductive film as shown in FIG. 24 using a sputtering apparatus, and the like, which is not shown. Next, a nickel layer 74 is formed on the surface of the nickel alloy film 73 by performing electro-forming (electrical plating) using the nickel alloy film 73 as the electrode as shown in FIG. 25. A master stamper 74A (imprint mold for imprinting) of nickel and the like, is obtained as shown in FIG. 26 by releasing the nickel layer 74 from the substrate 71. At this point, the surface of the master stamper 74A is washed as needed.

Meanwhile, the imprint mold for imprinting and imprinted replica according to the present embodiment are effective for ultrafine patterns corresponding to extremely high surface recording density such as density of over 500 Gbpsi (Gbit/ inch$^2$), in particular 1-10 Tbpsi. Specifically, by using an imprint mold which has approximately 25 nm pit interval patterns, it is possible to manufacture high density patterned media from the replica, of which the recording density is over approximately 1 Tbpsi.

To realize this, it is preferable to use the electron beam recording apparatus 10, and the like, which is capable of forming super-fine patterns, as a manufacturing method for a mask in which are formed concave and convex parts, in the manufacturing method of the imprint mold of the example of application.

<Manufacture of a Patterned Magnetic Recording Medium>

Next, an example of manufacturing a patterned recording medium using an imprinting apparatus is described.

FIG. 27 to FIG. 30 are cross-section diagrams showing an example of a manufacturing method for a patterned magnetic recording medium.

The process for manufacturing the patterned magnetic recording medium comprises the steps of: forming a replica, imprinting, etching, filling a non-magnetic material, and forming a protective film (lubrication film), and these steps are performed in sequence.

First, in the replica forming process, a base substrate (corresponding to a substrate 116 described below) for a magnetic recording medium which consists of a special chemically reinforced glass, a SI wafer, an aluminum plate, and other materials is prepared.

Figure 27:
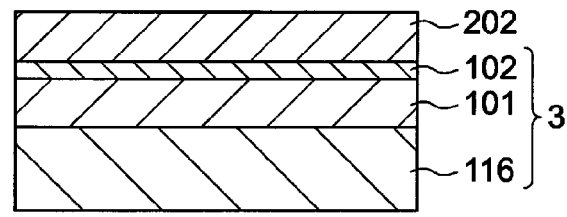
FIG. 27 is a cross-section diagram showing one example of a manufacturing method for a patterned magnetic recording medium.

Next, a recording film layer 101 is formed on the substrate 116 as shown in FIG. 27 using sputtering, and the like Note that in a case of manufacturing a vertical magnetic recording medium, the recording film layer 101 is a laminated structure of a soft magnetic foundation layer, an intermediate layer, a hard magnetic recording layer, and so on.

Further, a metal mask layer 102 of TA, TI, or the like, is formed on the recording film layer 101 by sputtering as shown in FIG. 27, and a substrate 3 is formed. Further, a thermoplastic resin resist such as polymethyl methacrylate resin (PMMA) is formed on the metal mask layer 102 as transfer material 202 by spin coating or the like.

Figure 28:
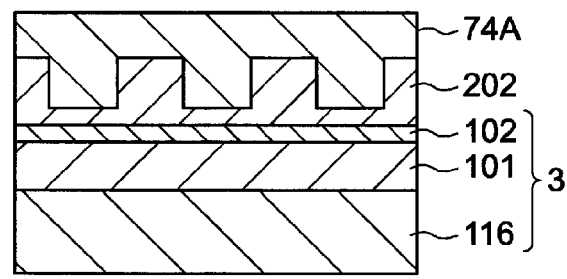
FIG. 28 is a cross-section diagram showing one example of a manufacturing method for a patterned magnetic recording medium.
Figure 29:
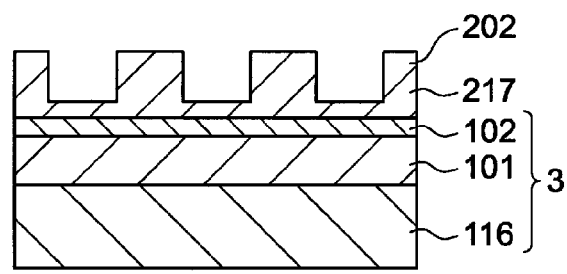
FIG. 29 is a cross-section diagram showing one example of a manufacturing method for a patterned magnetic recording medium.

Next, in the imprinting process, as shown in FIG. 28, the imprint mold 74A is set on an imprinting apparatus 200 which is not shown, such that the concave and convex surface faces the transfer material 202. That is, the imprint mold 74A is set and supported by a mold holding mechanism which is not shown.

In the imprinting apparatus, which is not shown, a work chamber (not shown) is decompressed as needed. Thereafter, in the imprinting apparatus, the transfer material 202 is heated as needed until it possesses flowability, and is then pressed. For example, the glass transition point of polymethyl methacrylate resin (PMMA) is approximately 100° C.; therefore, the imprinting apparatus heats the transfer material 202 to 120-200° C. (for example, approximately 160° C.) to make it flowable, and then presses the imprint mold 74A with a pressing force of 1-10000 kPa (for instance, approximately 1000 kPa) into the substrate 3. At this point, it is preferable to ensure the inside of the work chamber to be a vacuum state such that the attained degree of vacuum is lower than or equal to several hundred Pa (for example, approximately 10 Pa), because degasification occurs due to the remains of the solvent used when applying the transfer material 202, the moisture in the resin, and so on.

Next, by resuming the atmosphere in the work chamber to original state and releasing the imprint mold 74A, a replica 217 in which the concave and convex pattern of the imprint mold 74A are replicated onto the transfer material 202, as shown in FIG. 74A, is manufactured. The imprinting process is thus complete.

Figure 30:
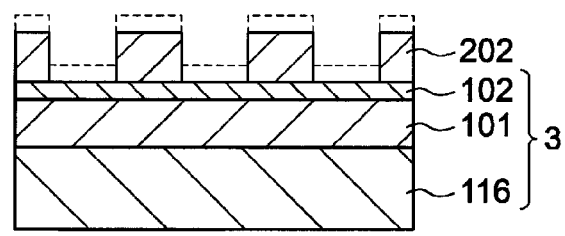
FIG. 30 is a cross-section diagram showing one example of a manufacturing method for a patterned magnetic recording medium.
Figure 31:
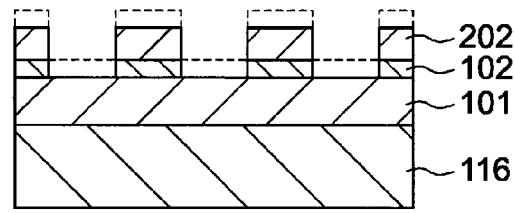
FIG. 31 is a cross-section diagram showing one example of a manufacturing method for a patterned magnetic recording medium.

Next, in the etching process, any unnecessary transfer material 202 as the etching mask is removed by soft ashing using $O_2$ gas, or the like as shown in FIG. 30. Next, as shown in FIG. 31, the metal mask 102 is etched using $CHF_3$ gas, or the like, with the transfer material 202 as the etching mask.

Figure 32:
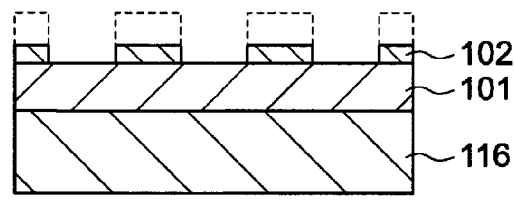
FIG. 32 is a cross-section diagram showing one example of a manufacturing method for a patterned magnetic recording medium.
Figure 33:
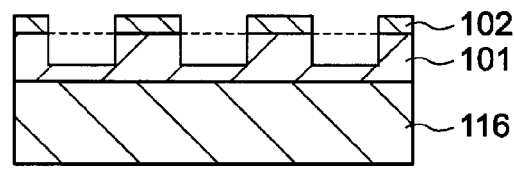
FIG. 33 is a cross-section diagram showing one example of a manufacturing method for a patterned magnetic recording medium.
Figure 34:
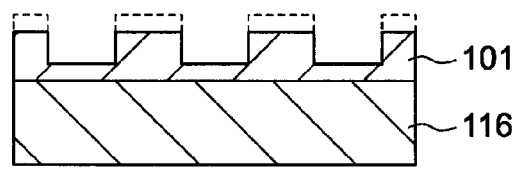
FIG. 34 is a cross-section diagram showing one example of a manufacturing method for a patterned magnetic recording medium.

Next, as shown in FIG. 32, the remaining transfer material 202 is removed by a wet process or a dry ashing process using $O_2$ gas. The recording film layer 101 is then dry-etched using AR gas, or the like, with the metal mask layer 102 as an etching mask, as shown in FIG. 33. Next, the remaining metal mask layer 102 is removed by a wet process or dry etching process, as shown in FIG. 34.

Figure 35:
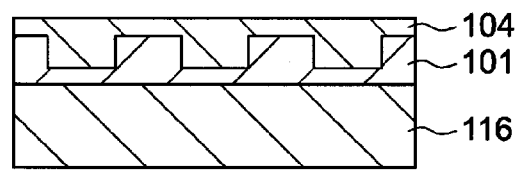
FIG. 35 is a cross-section diagram showing one example of a manufacturing method for a patterned magnetic recording medium.

Next, in the non-magnetic material filling process, a material (in a case of a magnetic recording medium, a non-magnetic material 104 such as $SiO_2$, or the like) which is not a recording material as shown in FIG. 35 is filled in the groove parts of the patterns by sputtering or coating process.

Figure 36:
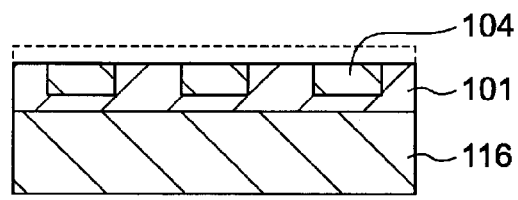
FIG. 36 is a cross-section diagram showing one example of a manufacturing method for a patterned magnetic recording medium.

Next, as shown in FIG. 36, the surface of the non-magnetic material 104 is polished and evened by etching back or chemical polishing. It is thus possible to achieve a structure in which the recording material is separated from the non-recording material 104.

Figure 37:
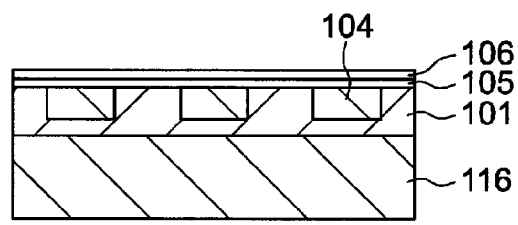
FIG. 37 is a cross-section diagram showing one example of a manufacturing method for a patterned magnetic recording medium.

Further, in the protection film (lubricating film) forming process, as shown in FIG. 37, for example, by forming a protection film 105 or a lubricating film 106 of the recording film layer 101 on the surface by a coating method or a dipping method, the patterned recording media are completed. Furthermore, by configuring hard disk drive housing, the patterned recording media can be incorporated into the hard disk drive housing. The patterned magnetic recording media can thus be manufactured by the above steps.

2. Manufacturing Method for a Patterned Medium Using Direct Recording

The patterned magnetic recording medium can be manufactured by creating a latent image recorded and exposed using the above pattern creation method, and etching the direct recording material using a resist mask formed by developing the latent image.

Figure 38:
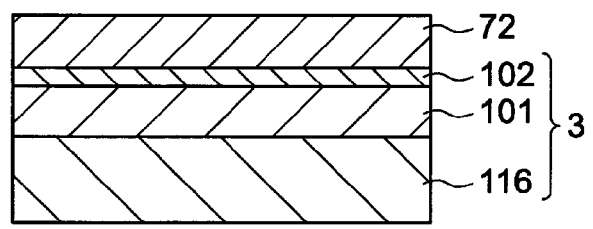
FIG. 38 is a cross-section diagram showing one example of a manufacturing method for a patterned magnetic recording medium.
Figure 39:
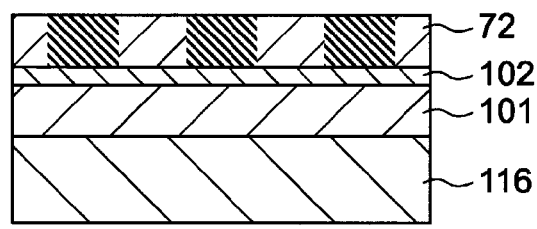
FIG. 39 is a cross-section diagram showing one example of a manufacturing method for a patterned magnetic recording medium.
Figure 40:
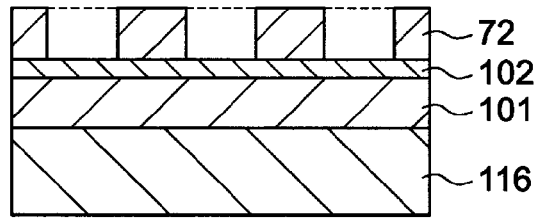
FIG. 40 is a cross-section diagram showing one example of a manufacturing method for a patterned magnetic recording medium.

FIG. 38 to FIG. 40 are cross-section diagrams showing an example of a manufacturing method for a patterned magnetic recording medium. FIG. 38 to FIG. 40 constitute part of the replica forming process described above (corresponding to FIG. 27 to FIG. 29 described above).

First, in the replica forming process, as in the replica forming process described above, a recording film layer 101 is formed on a substrate 116 for a magnetic recording medium, which consists of a special chemically reinforced glass, a SI wafer, an aluminum plate, and other materials.

Furthermore, a metal mask 102 of TA, TI, or the like is formed on the recording film layer 101 by sputtering, or the like, and a substrate 3 is formed. Further, an electron beam resist film 72 is formed on the metal mask layer 102 as a resist material needed for patterning using spin coating, or the like this electron beam resist film 72 is pre-baked as needed.

Next, the electron beam recording apparatus 10 performs recording on the electron beam resist film 72. What the electron beam recording apparatus 10 records on the electron beam resist film 72 at this occasion is a predetermined pattern corresponding to a pattern to be formed on a magnetic substrate in the data track part 82 shown in FIG. 15. The electron beam resist film 72 on which the predetermined pattern shown in FIG. 39 has been formed is post-exposure baked as needed.

Next, the pattern is formed by developing the electron beam resist film 72 as shown in FIG. 40. Note that the electron beam resist film 72 in which the pattern is formed is post-baked as needed. The processes after this are the same as the etching process, the non-magnetic material filling process, and the protective film (lubricating film) forming process shown in FIG. 30 to FIG. 37, substituting the transfer material 202 shown in FIG. 30 and FIG. 31 for the electron beam resist film 72.

What is claimed is:

1. A record control signal generating apparatus for generating and outputting to a recording apparatus a control signal for forming a latent image, wherein said recording apparatus comprises: a beam deflection unit that moves an irradiation position of an exposure beam, a substrate velocity adjustment unit that adjusts a moving velocity of a substrate along a tangential direction or a radial direction, and a blanking control unit that performs blanking control of irradiation of said exposure beam, said recording apparatus irradiating said exposure beam on a resist layer on said substrate while moving said substrate at said moving velocity along the tangential direction or the radial direction adjusted by said substrate velocity adjustment unit, and forming a latent image, said record control signal generating apparatus comprising:
   a record signal generating unit that generates a record signal of record data to be recorded on said substrate;
   a characteristic information signal generating unit that generates a characteristic information signal corresponding to the characteristic information of said recording apparatus as a signal compensation element, the characteristic information indicating a pre-measured positional misalignment between a beam irradiation position and a center of rotation of said substrate; and
   a signal generating unit that generates a compensated control signal to at least one of said beam deflection unit and said substrate velocity adjustment unit according to said record signal generated by said record signal generating unit and said characteristic information signal generated by said characteristic information signal generating unit.

2. The record control signal generating apparatus according to claim 1, wherein:
   said signal generating unit comprises:
   a first signal compensation unit that compensates said record signal generated by said record signal generating unit based on said characteristic information signal generated by said characteristic information signal generating unit; and
   a first deflection/substrate control signal generating unit that generates said compensated control signal to said beam deflection unit and said substrate velocity adjustment unit according to the record signal compensated by said first signal compensation unit.

3. The record control signal generating apparatus according to claim 2, wherein:
   said signal generating unit comprises:
   a second deflection/substrate control signal generating unit that generates a basic control signal to said beam deflection unit and said substrate velocity adjustment unit according to said record signal generated by said record signal generating unit; and
   a second signal compensation unit that compensates said basic control signal generated by said second deflection/substrate control signal generating unit based on said characteristic information signal generated by said characteristic information signal generating unit and generating said compensated control signal.

4. The record control signal generating apparatus according to claim 3, wherein:
   said characteristic information signal generating unit generates as said characteristic information signal an error information signal corresponding to error information based on dimensional precision and control precision of said recording apparatus.

5. The record control signal generating apparatus according to claim 4, wherein:
   said characteristic information signal input unit generates as said error information signal a deviation information signal corresponding to a deviation between a target irradiation position and an actual irradiation position of said exposure beam.

6. The record control signal generating apparatus according to claim 5, wherein:
   said first or second signal compensation unit performs compensation based on said characteristic information signal using a coordinate conversion process utilizing said deviation information signal and a timing delay process of said blanking control utilizing said deviation information signal in said blanking control unit; and
   in response to the compensation, said signal generating unit provided with said first or second signal compensation unit generates the compensated control signal to said beam deflection unit, said substrate velocity adjustment unit, and said blanking control unit.

7. The record control signal generating unit according to claim 5, wherein:
   said first or second signal compensation unit performs compensation based on said characteristic information signal, using a predetermined coordinate conversion process, a timing delay process of said blanking control utilizing said deviation information signal in said blanking control unit, and an irradiation position movement computation process of said exposure beam by said beam deflection unit in a manner corresponding to said coordinate conversion process and timing delay process; and
   in response to the compensation, said signal generating unit provided with said first or second signal compensation unit generates the compensated control signal to said beam deflection unit, said substrate velocity adjustment unit, and said blanking control unit.

8. A recording system comprising: a recording apparatus comprising:
   a beam deflection unit that moves an irradiation position of an exposure beam, a substrate velocity adjustment unit that adjusts a moving velocity of a substrate along a tangential direction or a radial direction, and a blanking control unit that performs blanking control of irradiation of said exposure beam, said recording apparatus irradiating said exposure beam on a resist layer on said substrate while moving said substrate at said moving velocity along the tangential direction or the radial direction and forming a latent image; and
   a record control signal generating apparatus for generating to said recording apparatus a control signal for forming said latent image; wherein:
   said record control signal generating apparatus comprises a signal generating unit that generates a compensated control signal to control at least one of said beam deflection unit and said substrate velocity adjustment unit of said recording apparatus according to:
   a record signal of record data to be recorded on said substrate; and a characteristic information signal corresponding to the characteristic information of said recording apparatus, the characteristic information indicating a pre-measured positional misalignment between a beam irradiation position and a center of rotation of said substrate.

9. The recording system according to claim 8, wherein said signal generating unit comprises:
a first signal compensation unit that compensating said record signal based on said characteristic information signal; and
a first deflection/substrate control signal generating unit that generating said compensated control signal to said beam deflection unit and said substrate velocity adjustment unit according to the record signal compensated by said first signal compensation unit.

10. The recording system according to claim 9, wherein:
said signal generating unit comprises:
a second deflection/substrate control signal generating unit that generates a basic control signal to said beam deflection unit and said substrate velocity adjustment unit according to said record signal; and
a second signal compensation unit that compensates said basic control signal generated by said second deflection/substrate control signal generating unit based on said characteristic information signal and generating said compensated control signal.

11. The recording system according to claim 10, wherein:
said signal generating unit generates said compensated control signal according to an error information signal corresponding to error information based on dimensional precision and control precision of said recording apparatus as said characteristic information signal.

12. The recording system according to claim 11, wherein:
said signal generating unit generates said compensated control signal according to a deviation information signal corresponding to a deviation between a target irradiation position and an actual irradiation position of said exposure beam as said error information signal.

13. The recording system according to claim 12, wherein:
said first or second signal compensation unit of said signal generating unit performs compensation based on said characteristic information signal using a coordinate conversion process utilizing said deviation information signal and a timing delay process of said blanking control utilizing said deviation information signal in said blanking control unit; and
in response to the compensation, said signal generating unit provided with said first or second signal compensation unit generates the compensated control signal to said beam deflection unit, said substrate velocity adjustment unit, and said blanking control unit.

14. The recording system according to claim 12, wherein:
said first or second signal compensation unit of said signal generating unit performs compensation based on said characteristic information signal, using a predetermined coordinate conversion process, a timing delay process of said blanking control utilizing said deviation information signal in said blanking control unit, and an irradiation position movement computation process of said exposure beam by said beam deflection unit in a manner corresponding to said coordinate conversion process and timing delay process; and
in response to the compensation, said signal generating unit provided with said first or second signal compensation unit generates the compensated control signal to said beam deflection unit, said substrate velocity adjustment unit, and said blanking control unit.

15. A recording apparatus comprising:
a beam deflection unit that moves an irradiation position of a light beam, a substrate velocity adjustment unit that adjusts a moving velocity of a substrate along a tangential direction or a radial direction, a blanking control unit that performs blanking control of irradiation of said exposure beam; and
a record control signal generating unit that generates a control signal for forming said latent image on said substrate;
said recording apparatus irradiating said exposure beam on a resist layer on said substrate while moving said substrate at said moving velocity along the tangential direction or the radial direction adjusted by said substrate velocity adjustment unit, and forming a latent image; wherein:
said control signal is compensated according a characteristic information signal corresponding to the characteristic information of said recording apparatus, the characteristic information indicating a pre-measured positional misalignment between a beam irradiation position and a center of rotation of said substrate.

* * * * *